(12) United States Patent
Crawford

(10) Patent No.: US 7,924,101 B1
(45) Date of Patent: Apr. 12, 2011

(54) SYSTEMS AND METHODS FOR IMPROVED VCO GAIN TRACKING LOOP

(76) Inventor: James A. Crawford, San Diego, CA (US)

( * ) Notice: Subject to any disclaimer, the term of this patent is extended or adjusted under 35 U.S.C. 154(b) by 82 days.

(21) Appl. No.: 12/414,589

(22) Filed: Mar. 30, 2009

Related U.S. Application Data

(60) Provisional application No. 61/040,478, filed on Mar. 28, 2008.

(51) Int. Cl.
*H03L 7/00* (2006.01)
(52) U.S. Cl. ............................................. 331/44; 331/16
(58) Field of Classification Search ..................... 331/44, 331/16, 17
See application file for complete search history.

(56) References Cited

U.S. PATENT DOCUMENTS

| | | | |
|---|---|---|---|
| 2005/0052251 A1* | 3/2005 | Jensen et al. | 331/25 |
| 2006/0145767 A1* | 7/2006 | Vaananen | 331/16 |

* cited by examiner

*Primary Examiner* — Joseph Chang
(74) *Attorney, Agent, or Firm* — Blairtech Solution LLC

(57) ABSTRACT

Methods and apparatus for calibrating the VCO element of a phase-locked loop to correct for non-linearities are disclosed. The modulation port of the VCO may be characterized to generate a tuning model, which may then be used to generate a correction signal to be combined with an input signal and applied to the VCO modulation port. The tuning model may be based on a third or higher order polynomial generated from a plurality of open-loop frequency measurements of the VCO.

17 Claims, 16 Drawing Sheets

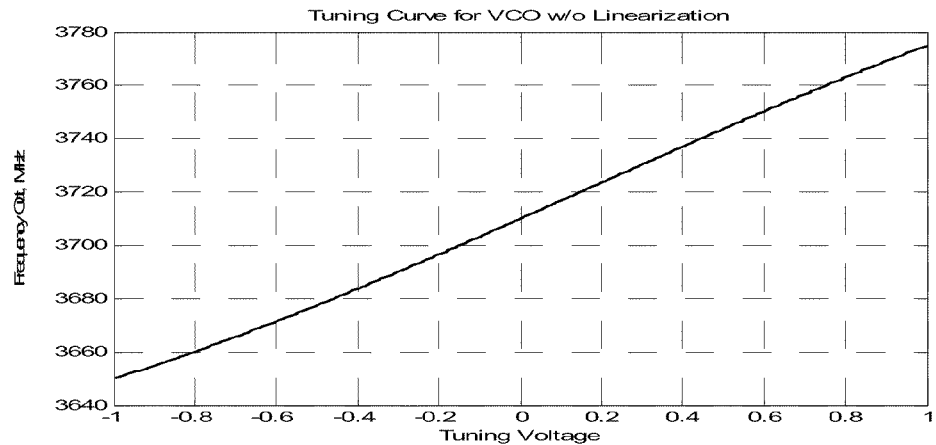
Figure 7 – Typical VCO Characteristic
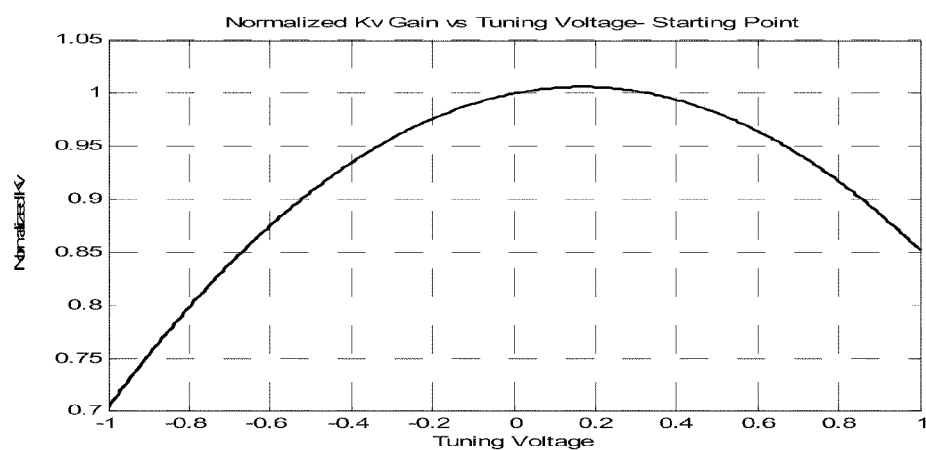
Figure 8 - $K_{FM}$ vs Tuning Voltage without Linearization

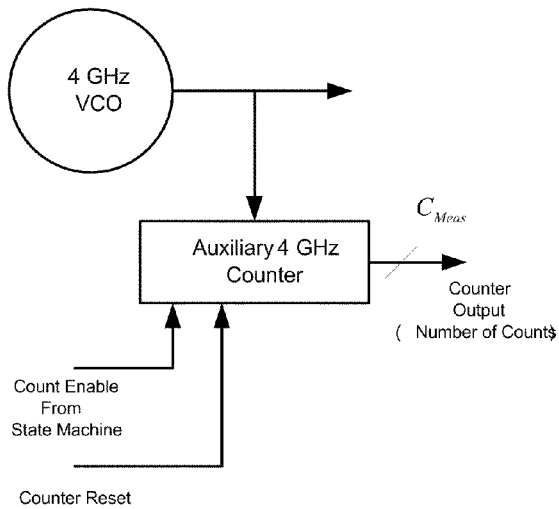
Figure 9 – Auxiliary Counter for Initial $K_{FM}$ Calibration
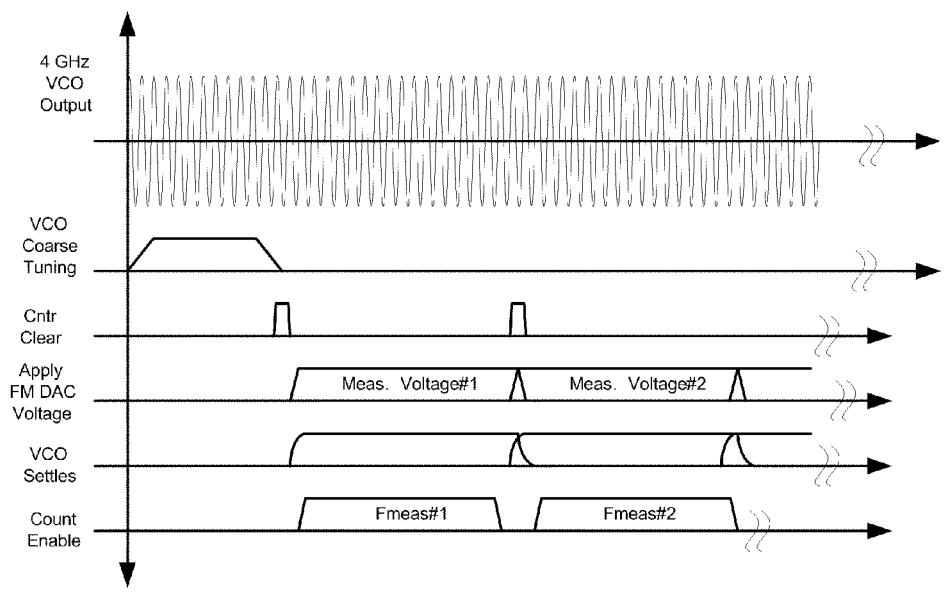
Figure 10 – Time Sequence for Initial $K_{FM}$ Frequency Measurements

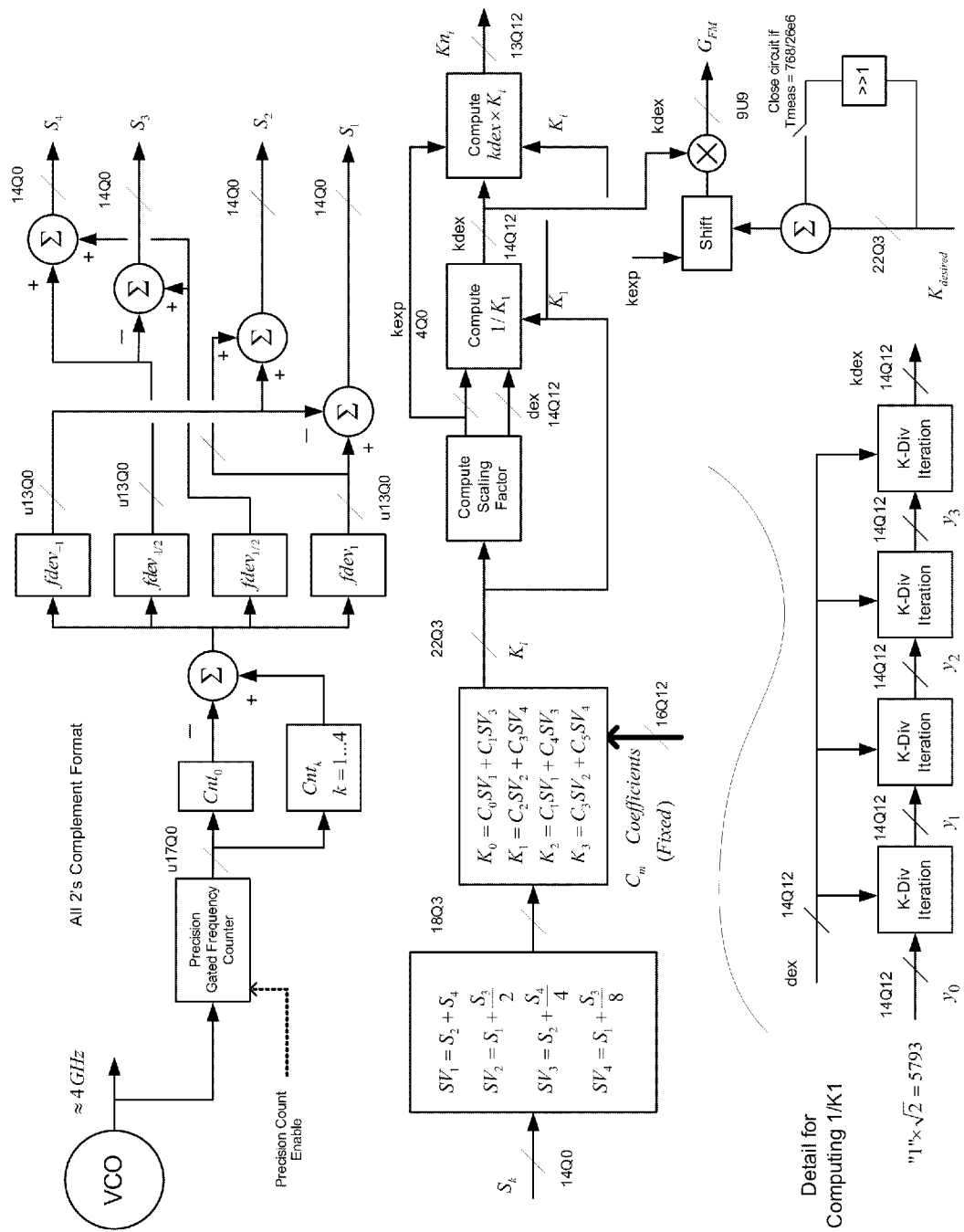
Figure 11 – System for Computing $K_i$ and $\delta v$ Used in $K_{FM}$ Calibration

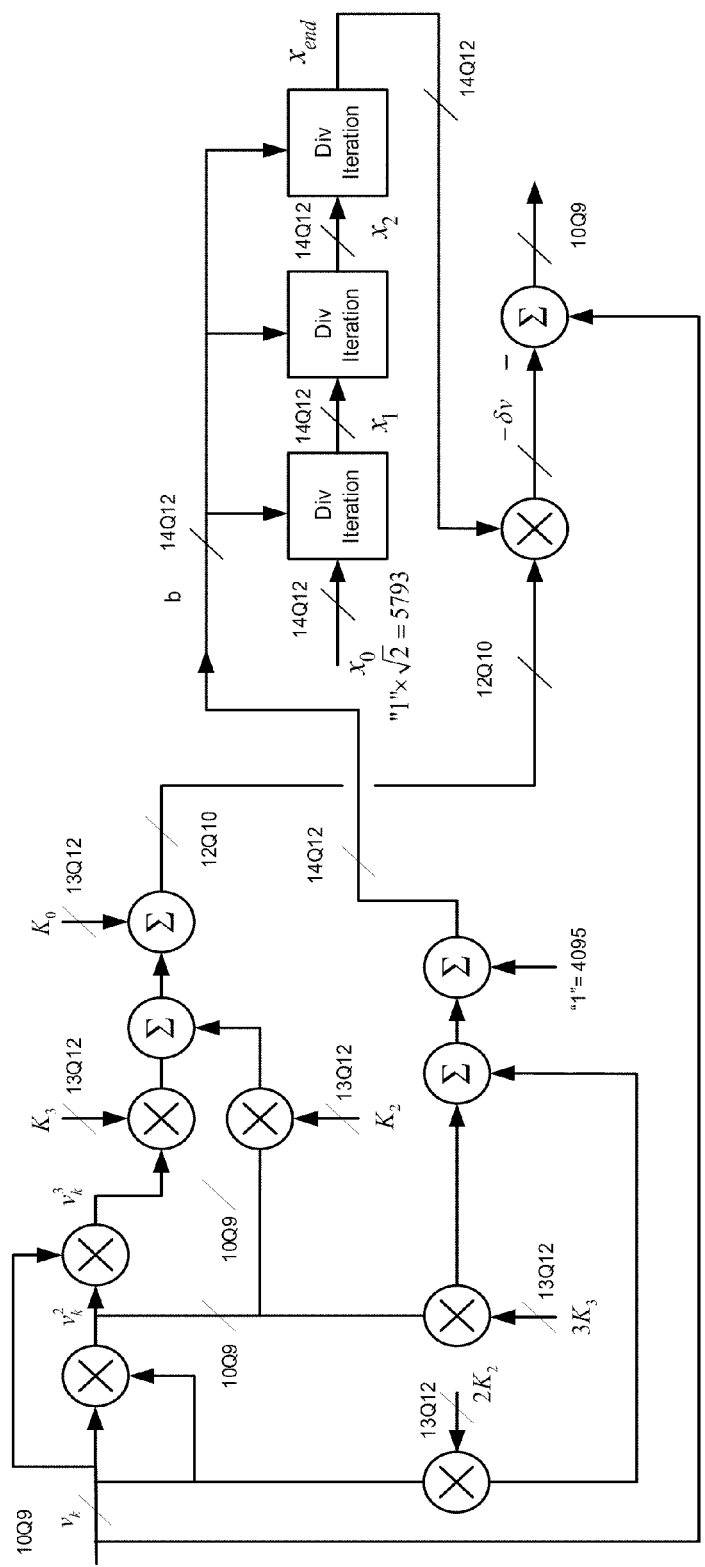
Figure 12 – VCO FM-Port Linearization Using Estimated $K_n$ Values from System Shown in Figure 11.

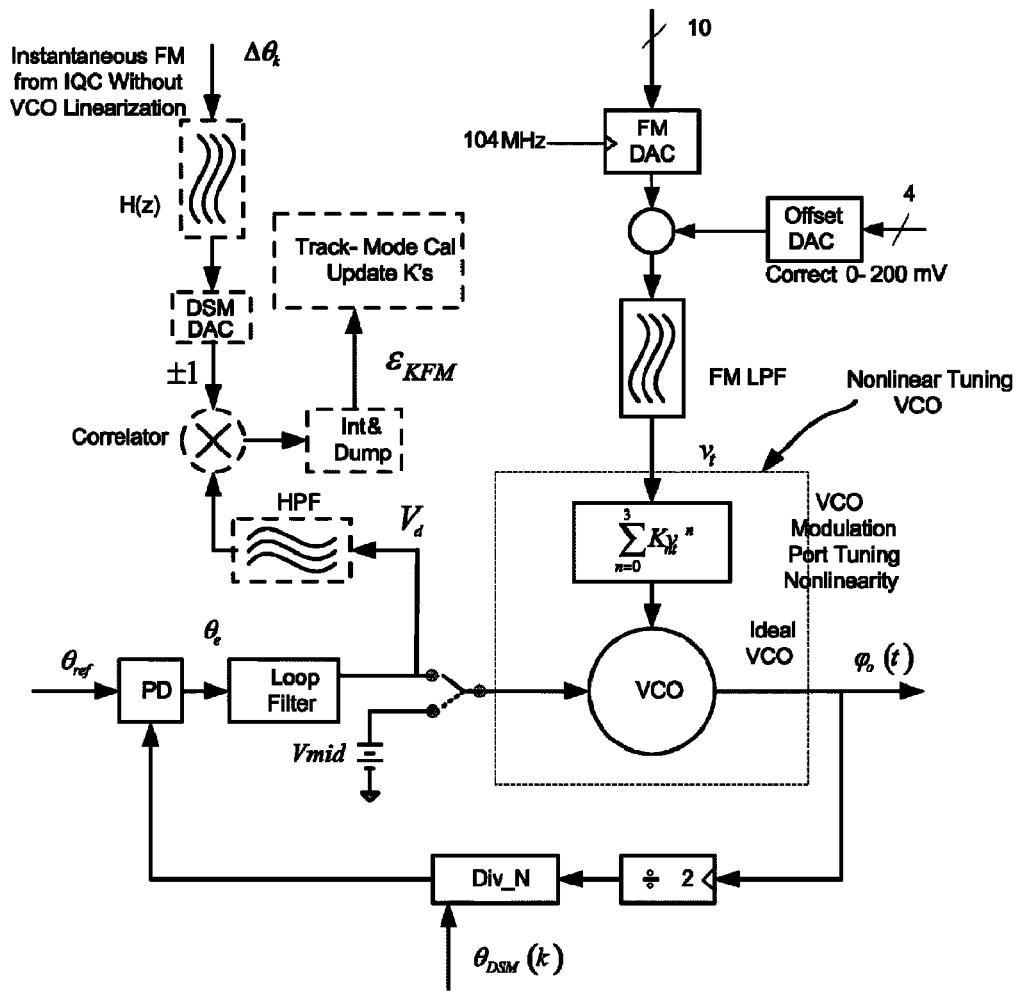
Figure 15 – KFMC Track Mode Circuit

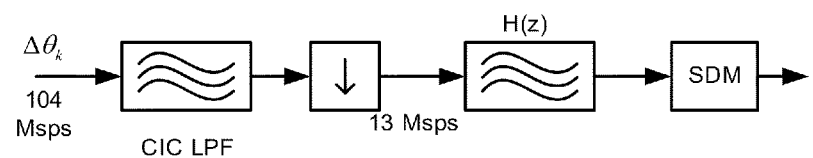
Figure 16 - H(z) detail in IQC
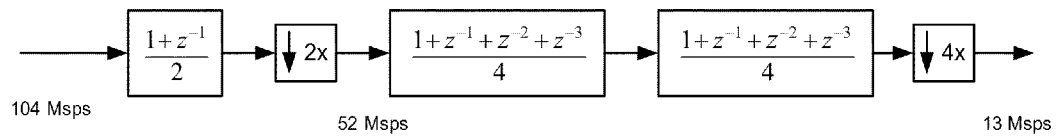
Figure 17 – CIC LPF Decimation

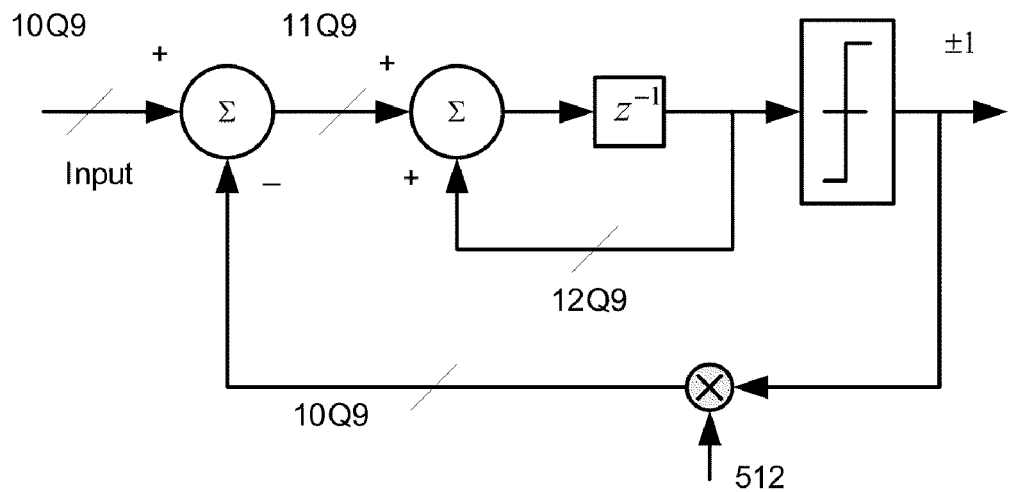
Figure 18 – Delta-Sigma Converter to Convert H(z) Output
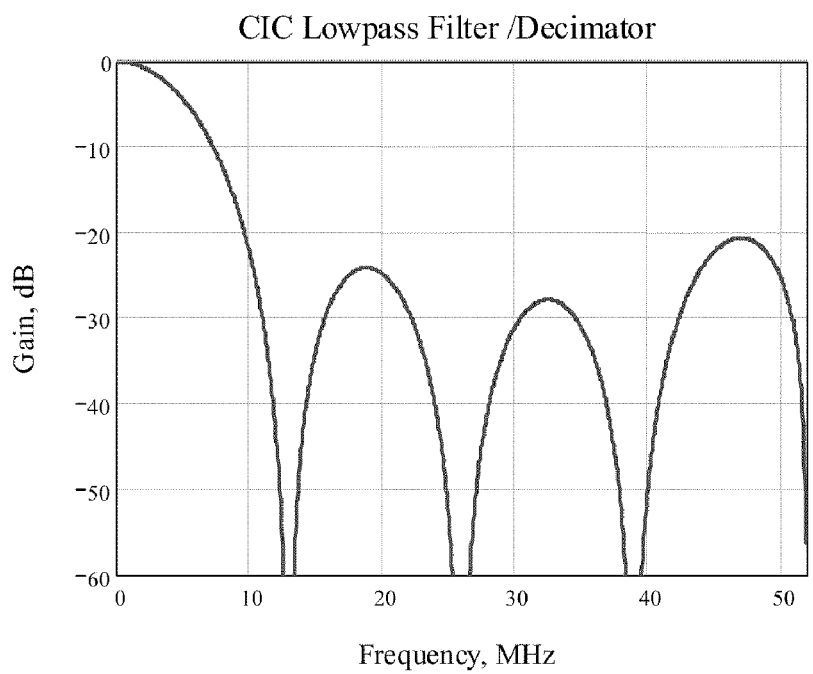
Figure 19

SYSTEMS AND METHODS FOR IMPROVED VCO GAIN TRACKING LOOP

CROSS REFERENCE TO RELATED APPLICATIONS

This application claims priority under 35 U.S.C. §119(e) to U.S. Provisional Patent Application Ser. No. 61/040,478, entitled SYSTEMS & METHODS FOR IMPROVED VCO GAIN TRACKING LOOP, filed Mar. 28, 2008. This application is also related to U.S. Utility patent application Ser. No. 12/057,206 entitled DIGITAL PLL CALIBRATION, filed on Mar. 27, 2008, to U.S. Pat. No. 6,985,703, entitled DIRECT SYNTHESIS TRANSMITTER, issued on Jan. 10, 2006, to U.S. Pat. No. 6,774,740, entitled SYSTEM FOR HIGHLY LINEAR PHASE MODULATION, issued on Aug. 10, 2004, to U.S. Utility patent application Ser. No. 11/863,772, entitled $K_{FM}$ ADJUSTMENT, filed on Sep. 28, 2007, and to U.S. Utility patent application Ser. No. 11/369,897, entitled LINEAR WIDEBAND PHASE MODULATION SYSTEM, filed on Mar. 6, 2006. The content of each of these applications is hereby incorporated by reference herein in its entirety for all purposes.

FIELD OF THE INVENTION

The present invention relates generally to phase/frequency modulators. More particularly, but not exclusively, the present invention relates to methods and architecture for direct phase/frequency modulation of a phase-locked loop with improved $K_{FM}$ calibration and tracking.

BACKGROUND

Phase modulation schemes are very effective and are therefore widely used in communication systems. A simple example of a phase modulation scheme is quaternary phase shift keying (QPSK). FIG. 1 shows a constellation diagram 100 that illustrates how QPSK maps two-bit digital data to one of four phase offsets. FIG. 2 shows a typical QPSK (or in-phase/quadrature (I/Q)) modulator 200 used to generate a phase-modulated signal. This technique relies on orthogonal signal vectors to realize the phase offsets—an inherently linear technique, since it depends solely on the matching of these orthogonal signals.

The I/Q modulator provides a straightforward approach to generating phase-modulated signals that is also suitable for more complex schemes such as Wideband Code Division Multiple Access (WCDMA) and Orthogonal Frequency Division Multiplexing (OFDM) systems. It is also possible to generate the phase-modulated signals using a phase-locked loop (PLL). This approach offers reduced circuitry and lower power consumption and, as a result, finds widespread use in narrowband systems.

In some systems direct modulation may be applied to a voltage controlled oscillator (VCO). This is a difficult task since the VCO gain depends on multiple variables. It would therefore be advantageous to provide systems and methods for accurately setting and tracking the VCO gain, $K_{FM}$.

SUMMARY

In one aspect the present invention relates to an apparatus for calibrating the gain of a voltage controlled oscillator (VCO) in a phase-locked loop (PLL), comprising logic to measure a gain tuning characteristic of the VCO, logic to generate a tuning model based on the tuning characteristic, and logic to generate a correction signal based on the tuning model.

In another aspect, the present invention relates to a method of operating a phase-locked loop, comprising determining a set of adjustment values for use in linearizing the gain tuning characteristics of a VCO component of the phase-locked loop, combining the adjustment values with a frequency modulation signal to generate a calibrated frequency modulation signal, and applying the calibrated frequency modulation signal to a VCO modulation port.

In another aspect, the present invention relates to a method of calibrating the gain of a VCO, comprising configuring the VCO in an open-loop configuration, applying ones of a plurality of frequency test signals to the VCO to generate a corresponding set of VCO tuning characteristics, generating a VCO tuning model based on the tuning characteristics, and generating a VCO correction signal based on the VCO tuning model.

Additional aspects of the present invention are further described below in conjunction with the appended drawings.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein:

FIG. 7 illustrates a typical VCO tuning characteristic.

FIG. 8 illustrated non-linearity in the VCO characteristic of FIG. 7.

FIG. 9 illustrates an embodiment of an auxiliary counter for initial KFM calibration.

FIG. 10 illustrates a timing sequence for initial KFM calibration.

FIG. 11 illustrates an embodiment of a system for computing parameters used in KFM calibration.

FIG. 12 illustrates an embodiment of a VCO FM port linearization system.

FIG. 15 illustrates an embodiment of a modified circuit in accordance with FIG. 6 for KFMC track mode.

FIG. 16 illustrates an embodiment of an H(z) block in an IQC.

FIG. 17 illustrates an embodiment of a CIC LPF decimation block.

FIG. 18 illustrates an embodiment of a delta-sigma converter to convert the digital input to a 1-bit output.

FIG. 19 illustrates the frequency domain transfer function for the circuit shown in FIG. 17.

DETAILED DESCRIPTION OF EMBODIMENTS

Figure 1:
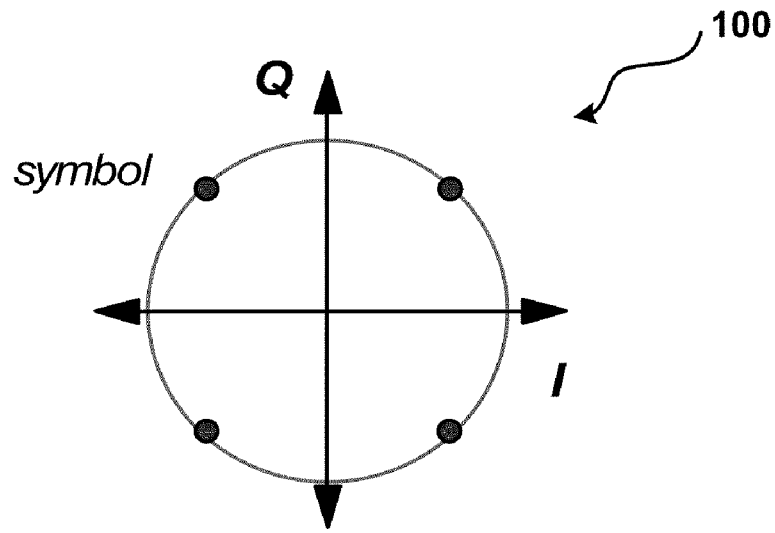
FIG. 1 shows a constellation diagram that illustrates how QPSK maps two-bit digital data to one of four quadrants in IQ space.
Figure 2:
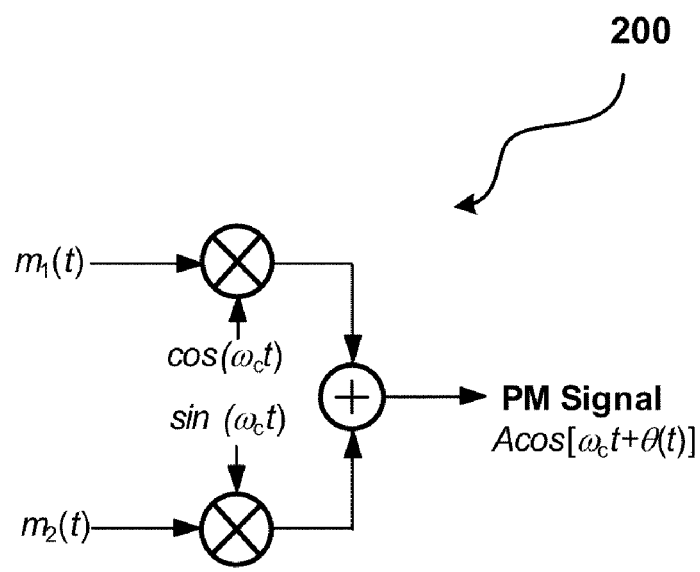
FIG. 2 illustrates a diagram of a typical I/Q modulator.
Figure 3:
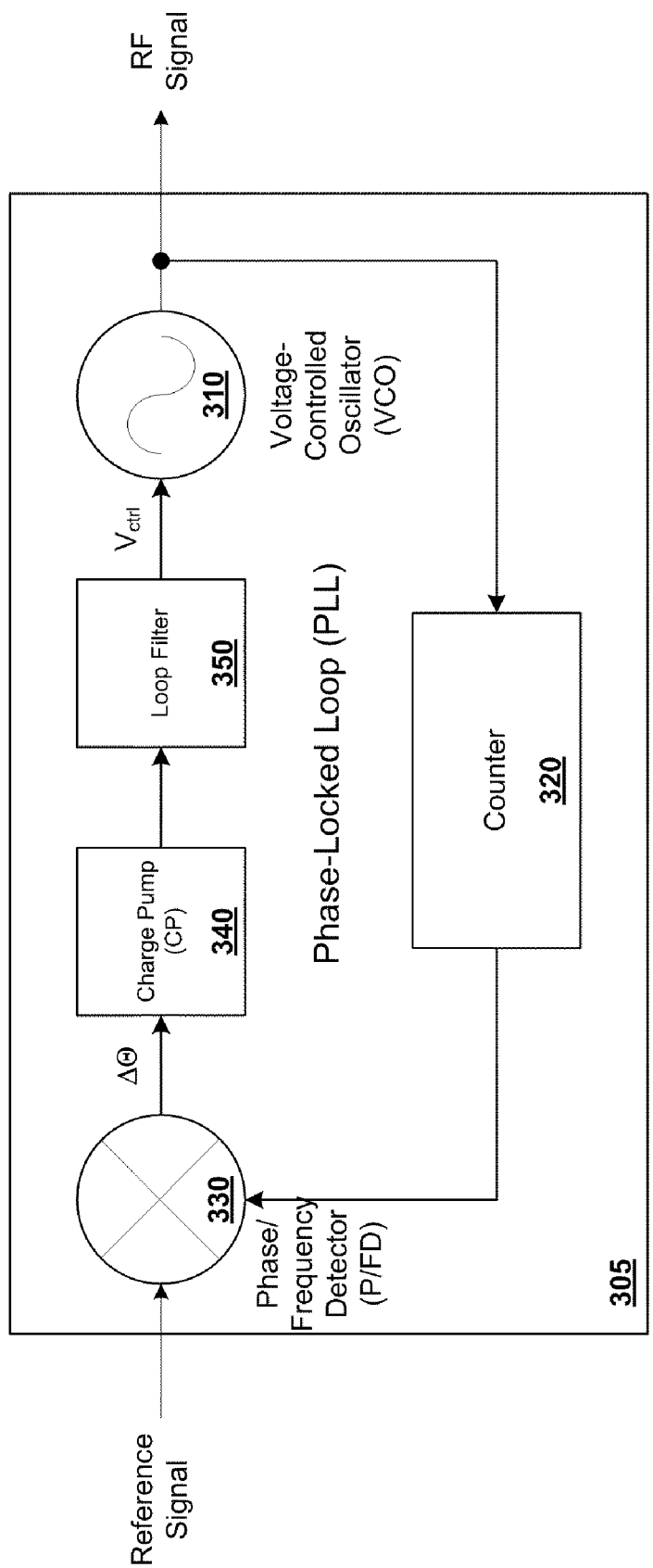
FIG. 3 illustrates a PLL that is used to synthesize a radio frequency carrier signal.

FIG. 3 shows a phase-locked loop (PLL) 305. The PLL 305 includes a voltage-controlled oscillator (VCO) 310, a feedback counter 320, a phase/frequency detector (PFD) 330, a charge pump (CP) 340, and a loop filter (LF) 350. Elements of the PLL 305 of FIG. 3 are further illustrated by the mathematical model 405 shown in FIG. 4.

The PLL uses feedback to minimize the phase difference between a very accurate reference signal and its output (RF) signal. As such, it produces an output signal at a frequency given by $$f_{vco} = Nf_{REF}$$

where $f_{vco}$ is the frequency of the VCO 310 output signal, N is the value of the feedback counter 320, and $f_{REF}$ is the frequency of the reference signal.

Figure 4:
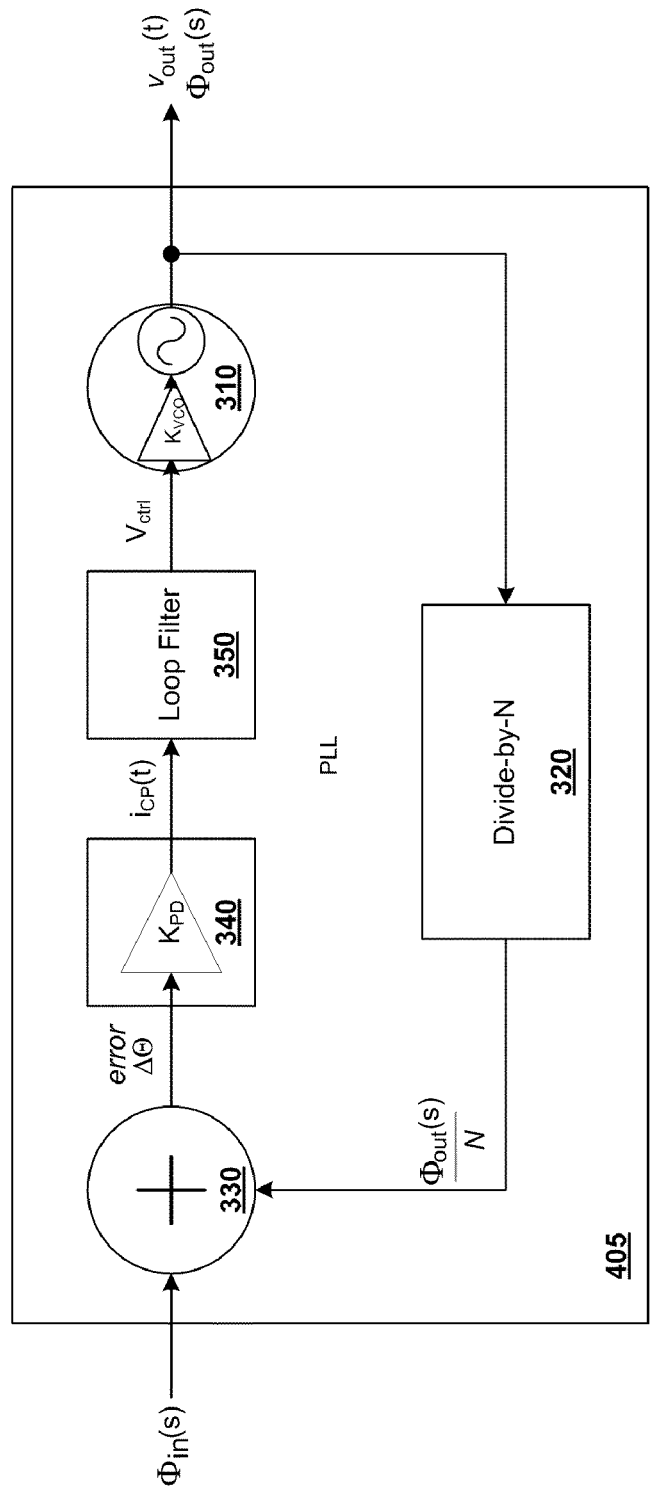
FIG. 4 illustrates a mathematical model of the PLL shown in FIG. 3.

The VCO 310 produces an output signal at a frequency set by the control voltage $v_{ctrl}$ according to $$v_{out}(t) = A\cos(\omega_o t + K_{vco}\int v_{ctrl}(t)dt)$$

where $\omega_o$ is the free-running frequency of the VCO 310 and $K_{vco}$ is the gain of the VCO 310. The VCO 310 can be modeled as shown in FIG. 4, where the gain $K_{vco}$ describes the relationship between the excess phase of the carrier $\Phi_{out}$ and the control voltage $v_{ctrl}$ with $$\frac{\Phi_{out}(s)}{v_{ctrl}(s)} = \frac{K_{vco}}{s}$$

where $K_{vco}$ is in rad/s/V. The VCO 310 drives the feedback counter 320, which simply divides the output phase $\Phi_{out}$ by N.

When the PLL 305 is locked, the phase detector 330 and charge pump 340 generate an output signal $i_{CP}$ that is proportional to the phase difference $\Delta\theta$ between the two signals applied to the phase detector 330. The output signal $i_{CP}$ can therefore be expressed as $$i_{CP}(s) = K_{pd}\frac{\Delta\theta(s)}{2\pi}$$

where $K_{pd}$ is in A/radian and $\Delta\theta$ is in radians.

Figure 5:
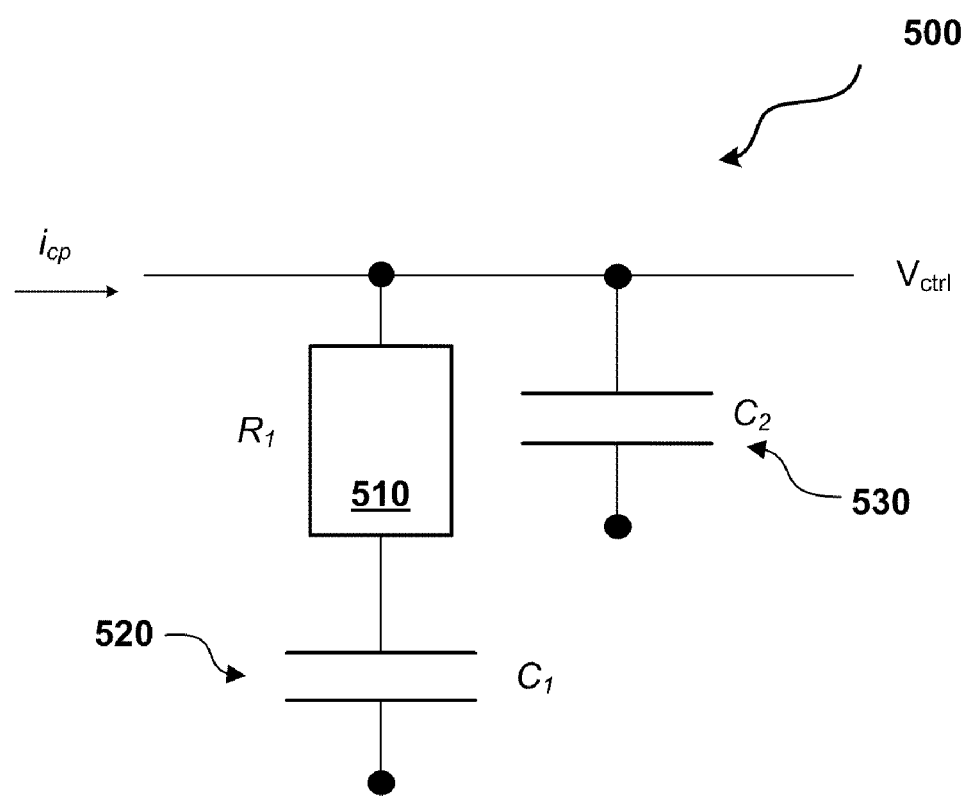
FIG. 5 illustrates the loop filter portion of a PLL.

FIG. 5 depicts a loop filter 350 comprising a resistor $R_1$ (510) and capacitors $C_1$ (520) and $C_2$ (530). As shown, the loop filter 350 transforms the output signal $i_{CP}$ to the control voltage $v_{ctrl}$ as follows $$v_{ctrl}(s) = i_{out}(s)\left(\frac{sR_1C_1 + 1}{s^2R_1C_1C_2 + s(C_1+C_2)}\right)$$

where a zero (e.g., at $1/R_1C_1$) has been added to stabilize the second order system and the capacitor $C_2$ has been included to reduce ripple on the control voltage $v_{ctrl}$. Combining the above relations yields the closed-loop response of the system to an input signal $$T_1(s) = \frac{NK_{PD}K_{VCO}Z(s)}{sN + K_{PD}K_{VCO}Z(s)}$$

The value N of the feedback counter 320 sets the output frequency of the PLL 305. Its digital structure restricts N to integer numbers. As a result, the frequency resolution (or frequency step size) of the integer-N PLL 305 is nominally set by $f_{REF}$. Fortunately, it's possible to dramatically decrease the effective frequency step by manipulating the value of N to yield a non-integer average value. This is the concept of a fractional-N PLL.

$K_{FM}$ Calibration Overview

Figure 6:
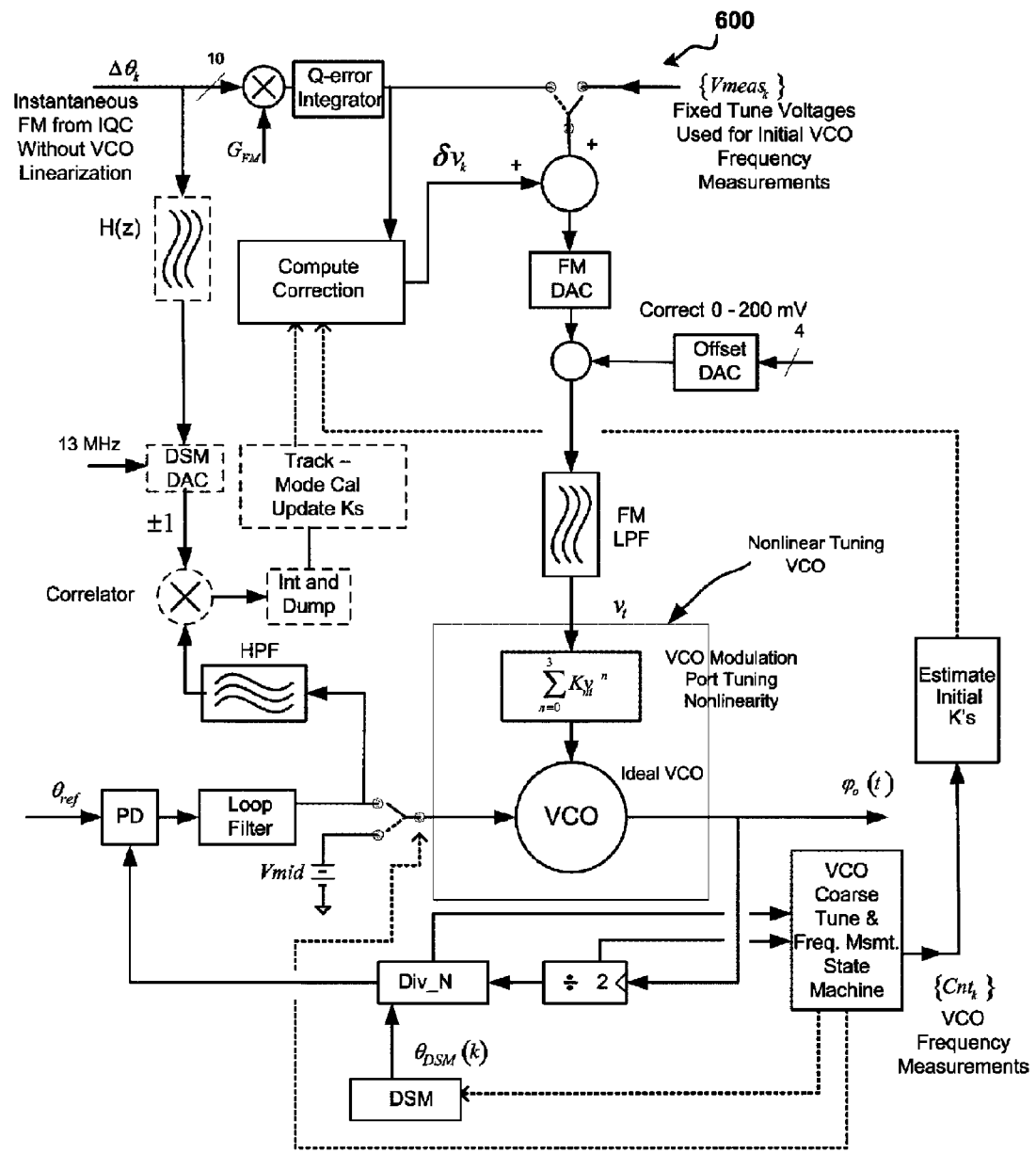
FIG. 6 illustrates one embodiment of a system for KFM calibration.

FIG. 6 is a high-level block diagram showing major hardware elements of an embodiment of a system for $K_{FM}$ calibration in accordance with aspects of the present invention. As shown in FIG. 6, the KFMC ($K_{FM}$ Calibration) circuitry may be inter-connected with a transmit phase locked loop (TxPLL). In some embodiments KFMC circuitry may include both an initial calibration module and a tracking mode calibration module. Hardware associated with an initial calibration module is shown in solid block outline form in FIG. 6, whereas hardware associated with a tracking mode module is shown in dashed form. The description that follows is related primarily to the initial calibration module.

Ideally a VCO's tuning characteristic would be a perfect affine transformation (i.e. linear transformation plus translation) such that the output frequency equals the input frequency plus a gain factor multiplied by the input voltage. However, in reality this is rarely the case. A more typical VCO tuning characteristic is shown in FIG. 7. This VCO tuning characteristic may appear to be fairly linear; however, the slope varies significantly as shown in more detail in FIG. 8.

In order to account for the VCO's non-linearities, the VCO tuning characteristic versus applied voltage can be modeled by a polynomial function, such as, for example, a third order polynomial as shown in equation:

$$df(v) = K_0 + K_1v + K_2v^2 + K_3v^3 \quad (1)$$

This model can then be used to rapidly characterize the VCO's tuning characteristics. In some embodiments the tuning may need to be performed as rapidly as 100 microseconds (a 150 μs time may be required for GSM/EDGE—specific parameters associated with GSM/EDGE applications are denoted herein by parentheses in the description that follows). One approach to characterization is based on a process of taking open-loop frequency measurements of the VCO using a frequency counter and counter based techniques at multiple input voltages supplied by the FM digital to analog converter (DAC) to the VCO's modulation port. For example, in one exemplary embodiment, five measurements may be used. These measurements are performed and then provided to a module wherein coefficients of the model polynomial, such as the polynomial shown above, are determined.

It is noted that in some embodiments a cubic polynomial provides a good estimate of the VCO characteristics, however, other polynomial degrees may alternately be used. In addition, it may be desirable to assess the linear gain term K1 for v=0, wherein modeling with at least a cubic polynomial may be desirable. Most of the VCO tuning characteristics in typical VCOs contain enough cubic curvature that the K1 term cannot be accurately estimated unless a cubic (or higher order) polynomial fit is used for the calibration process. Consequently, it will be appreciated that while the embodiments disclosed herein are typically described with respect to a cubic polynomial, other polynomials are contemplated within the spirit and scope of the invention.

Once the polynomial coefficients (Ki) have been estimated, a correction voltage δvk may be calculated to correct the output samples vk of the in-phase and quadrature converters (IQC). The correction voltages δvk may then be applied to each in-phase and quadrature converter (IQC) sample, vk, with the corrected samples then applied to the VCO, thereby effectively linearizing the VCO's modulation port tuning characteristic. In accordance with one exemplary embodiment, the Ki parameters may only be computed once per initial calibration task, whereas the correction voltages δvk may be computed at the full sample rate, for example at a 104 Msps rate in one exemplary embodiment.

Frequency Measurement

In some embodiments, in order to constrain the implementation complexity, the best method of measuring frequency may be to use a frequency counter based method. Since the time available to do the KFM calibration is typically fixed, it may also be desirable to fix the time duration allowed for each frequency measurement.

Assuming that a cubic polynomial is used to curve-fit the modulation port's frequency-versus-voltage characteristic, a minimum of 4 frequency measurements must be made in order to solve for all of the polynomial coefficients. However, using techniques known in the art, the numerical computations may be greatly simplified if a fifth measurement can be taken, and therefore this approach is assumed throughout the descriptions that follow. The time duration τM used for each measurement must be long enough so that sufficient frequency resolution accuracy is achieved. For example, with 5 measurements required and 100 μs (150 μs) available, only 20 μs (30 μs) is available for each frequency measurement. In some embodiments, such as for systems based on GSM/EDGE, the smaller TxVCO tuning sensitivity combined with the accuracy requirement for $K_1$ mandate that the time duration for each frequency measurement be increased from approximately 20 μs to 30 μs.

In some embodiments, the required frequency precision along with the short time available for the measurements require that an auxiliary counter be used to count the VCO cycles. An embodiment of this approach is illustrated in FIG. 9. Other techniques, such as using the PLL's inherent capabilities may be applied; however, they will typically be too slow. The accuracy of the time-gating period for the frequency measurements may also be critical. At 4 GHz, one cycle is only 0.25 nanoseconds, and with current technology it is unlikely that the gating period can be controlled any more accurately without great difficulty. Assuming a fixed time base duration for each measurement, it is noted that the accuracy of the time-gating period over which the accumulating counters observe the VCO's zero-crossings dictates almost exclusively how accurate the algorithm may be performed.

In order to optimize performance and minimize complexity, it may be desirable to choose the time measurement interval based on a reference clock. In one exemplary embodiment a 26 MHz reference clock is available, providing time intervals according to the equation $$\tau_M = \frac{L}{26 \text{MHz}} \sec \quad (2)$$

Choosing L in this equation equal to 512 (768) results in a measurement interval $\tau_M$=19.692308 μs (29.53846 μs), which is conveniently just less than the 20 μs (30 μs) allocation permitted.

In some embodiments, the frequency measurements for KFMC must be done after a successful VCO coarse-tuning operation, as shown in FIG. 10, with the PLL still running in open-loop mode. The VCO coarse-tuning step must be done with (i) constant (nominal) mid-range voltage applied at the VCO's control port and with (ii) the "zero" centered voltage applied at the modulation port input to the VCO.

Following the VCO coarse-tuning step, the PLL is left open-loop with the same mid-range voltage applied at the VCO control port, and the VCO frequency measurements may be made according to the following steps:

For each k, k=1 to 5
Apply voltage $\text{Vmeas}_k$ to the VCO's modulation port using the FM DAC
Allow the VCO to accurately settle in frequency with FM low pass filter (LPF) present
Reset frequency counter
Wait for VCO to settle; after VCO has settled, high-frequency counter is enabled for precisely $\tau\tau_M$ seconds
Counter value is read afterward to give $\text{Cnt}_k$ In some modes, such as WCDMA, the modulation port voltages must be kept very clean. For example, for WCDMA the modulation port tuning sensitivity will be as high as 150 MHz/V. At 4 GHz and a measurement time duration of $\tau_M$=19.692308 μs (29.53846 μs), the frequency counter will accumulate 78,769 counts (118,154 counts). In order for any control-port or FM-port noise to represent less than 0.5 "ticks" in the frequency counter, the frequency accuracy for these two VCO ports must be held to within 33.85 kHz. Assuming VCO port tuning sensitivities as given below, the voltage stability demands for these tuning voltages are as follows:

VCO PLL Control Port (All Modes):

40 MHz/V–Voltage stability during each 30 μs interval+/−0.85 mV or better.

WCDMA Mode:

145 MHz/V–Voltage stability during each 30 μs interval+/−0.25 mV or better.

If voltage stability is lower than these limits, it may impact frequency measurement accuracy.

Vmid corresponds to this mid-range control port voltage in FIG. 6. The "zero" voltage applied to the VCO's modulation port corresponds to $\text{Vmeas}_0$ in FIG. 6. It may be beneficial to provide the modulation port voltages using the FM DAC in order to have the system remain scaling-invariant.

At 4 GHz with $\tau_M \approx 20$ μs (30 μs), the counter will accumulate roughly 80,000 (120,000) counts. Even so, a 1-count error at this frequency translates to a frequency measurement error of ±50 kHz (±33 kHz). In one embodiment operating at 4 GHz, if the frequency deviation being used for WCDMA is 26 MHz, this much error represents 0.2% which is sizeable compared to the 0.5% performance levels that may be desired. Consequently, since the measurement time interval $\tau_M$ is quite short, every count is important. For this reason, use of a direct-divide at 4 GHz rather than after the D1 divider or some other prescaler in the TxPLL may be desirable.

In some embodiments performance may be improved by ensuring that the VCO frequency is set to remain constant to within approximately ±35 kHz or better of its true tuning characteristic during the entire calibration procedure and rise and fall times of the gating period must be set so as to not adversely impact precision.

Table 1 below illustrates TxVCO requirements of exemplary embodiments based on WCDMA and GSM.

TABLE 1

TxVCO Requirements of an Exemplary Embodiment

| Item | Value | Comments |
| --- | --- | --- |
| Number of Frequency Measurements | 5 | |
| Measurement Time Interval | | Frequency counter counting |
| WCDMA | 512 | 26 MHz clock periods. |
| GSM/EDGE | 768 | " |
| GSM/EDGE Alternate | 512 | " |
| Tx VCO Frequency Stability | | Maximum allowable frequency drift (@4 GHz) over full initial $K_{FM}$ calibration time (e.g., 100 µs). 2-sigma confidence. |
| WCDMA | ±172 kHz | |
| GSM/EDGE | ±38 kHz | |
| GSM/EDGE Alternate | ±38 kHz | |
| VCO Coarse-Tuning Frequency Error | ±10 MHz | Ties into TxVCO coarse tuning accuracy at ≈4 GHz |
| WCDMA | ±10 MHz | |
| GSM/EDGE | | |
| GSM/EDGE $K_{FM}$ Range | | |
| Low-Band | 14-22 MHz/V | |
| High-Band | 14-22 MHz/V | |
| WCDMA $K_{FM}$ Range | | |
| Low-Band | 60-75 MHz/V | |
| High-Band | 120-150 MHz/V | |

Measurement Units

Assume that the complete RF frequency word to the feedback divider, including the Sigma-Delta Modulator's (SDM) portion is represented by N.F, where N is the integer portion and F represents the fractional portion. Since the D1 divider is included in the TxPLL feedback loop, the actual RF frequency that is being programmed is given by $$f_o = 2 \times 26\text{MHz} \times \left(N + \frac{F}{2^P}\right) \quad (3)$$

where P is the fractional modulus corresponding to the SDM. For one exemplary embodiment P=24 bits.

Any frequency error left after the VCO coarse tuning step has been performed will eventually be removed by the closed-loop action of the PLL. It must be assumed that the VCO's modulation port tuning characteristic will be the same after this small frequency correction (for example, less than ±15 MHz at 4 GHz) has subsequently been made.

It is noted that in one exemplary embodiment, VCO coarse tuning accuracy must be better than ±15 MHz in order to prevent the $K_{FM}$ calibration information from being altered between the calibration step and PLL operation after the PLL has achieved complete phase lock. It is also assumed that all process-related calibrations, VCO voltage-swing calibrations, etc. have been done prior to the $K_{FM}$ Calibration.

The first VCO frequency measurement is then performed with $Vmeas_0=0$, corresponding to the center of the modulation port voltage range. All VCO frequency deviations at the other measurement voltages are made relative to this center measurement. Assuming that the $Vmeas_0$ measurement results in a measured value of $Cnt_0$ accumulated counts by the frequency counter, the other frequency deviation measurements are denoted by $$f\text{dev}_k = (Cnt_k - Cnt_0)\Delta_F \quad (4)$$

where in an exemplary embodiment $\Delta_F$=26 MHz/L=50.78125 kHz (33.85417 kHz).

In the steps that follow, $Cnt_0$ will always be assumed to be the frequency count made with the modulation port input voltage set to "zero" (i.e., $Vmeas_0$=mid-value). All subsequent frequency deviations caused by different applied modulation measurement voltages are then referenced to this mid-value result as given by (4). For this reason, it may be important in some embodiments that the VCO exhibit no re-trace or memory errors when tuned with different applied DC measurement voltages.

In one embodiment, it may be assumed that the VCO applied measurement voltage will cause the VCO frequency to move ±150 MHz maximum. With $\Delta_F$ as defined, the span of integer values representing the measured fdev values will be −2954 to 2954 (−4431 to 4431) which would require a 13-bit 2's complement value to represent. Most of this range is due to the linear gain-term, but since its value is unknown at the beginning of the measurement activities, there is no recourse but to accept this as a requirement.

Therefore, frequency measurements should be made relative to the measurement made with "zero" applied voltage at the VCO's modulation port input. For $\tau_m$=512/26 MHz (768/26 MHz), $\Delta_F$=50.78125 kHz (33.85417 kHz). The fdevk values should be computed as 13Q0 values in 2's complement format.

Using Frequency Measurements to Characterize the VCO Modulation Tuning Port

Any VCO tuning curve fit will be scaling-invariant so long as the same reference voltage source is used in the measurement as is used in applying the FM modulation. It may therefore be important that the FM DAC be used to perform the preceding frequency measurements (i.e., used as the source of the measurement voltages) in the same way and using the identical voltage reference as when it is used for impressing FM on the VCO, or an equivalent DAC be used.

The frequency deviation versus applied modulation port tuning voltage characteristic may be represented by $$f_{vco}(v) = K_0 + K_1 v + K_2 v^2 + K_3 v^3 \quad (5)$$

where the $K_i$ are polynomial coefficients to be determined. Ideally, all of the terms in (5) would be zero except for $K_1$, making the function linear. In reality, however, none of the coefficients are necessarily zero and even the linear gain term $K_1$ may not be known precisely. Therefore, in one exemplary embodiment the $K_{FM}$ processing seeks to first linearize the FM port tuning characteristic, and then make sure that the linear gain term has been properly adjusted as well.

Accounting for some possible error in the frequency measurements $fdev_k$ at each measurement voltage $v_k$, a least-squared error curve fit may be used. This approach may be particularly attractive if it can be made adequately simple, fast, and efficient. The desire to include tuning imperfections up through $3^{rd}$-order make a systematic approach like this more or less necessary.

In some embodiments, the most difficult part of the computations can be pre-computed when the $v_k$ voltages are cleverly selected a priori as described herein. One approach involves determining a solution to the Vandermode equation given by $$\begin{bmatrix} n & \sum_k v_k & \sum_k v_k^2 & \sum_k v_k^3 \\ \sum_k v_k & \sum_k v_k^2 & \sum_k v_k^3 & \sum_k v_k^4 \\ \sum_k v_k^2 & \sum_k v_k^3 & \sum_k v_k^4 & \sum_k v_k^5 \\ \sum_k v_k^3 & \sum_k v_k^4 & \sum_k v_k^5 & \sum_k v_k^6 \end{bmatrix} \begin{bmatrix} K_0 \\ K_1 \\ K_2 \\ K_3 \end{bmatrix} = \begin{bmatrix} \sum_k f_k \\ \sum_k v_k f_k \\ \sum_k v_k^2 f_k \\ \sum_k v_k^3 f_k \end{bmatrix} \quad (6)$$

where n is the number of measurement points used. Assume for example that n=5 and that the $v_k = \{0, -1, -\frac{1}{2}, \frac{1}{2}, 1\}$. If actual different voltages are used, the $v_k$ can be assumed to simply be normalized voltage values. Under these assumptions, the solution is given by $$\begin{bmatrix} K_0 \\ K_1 \\ K_2 \\ K_3 \end{bmatrix} = \begin{bmatrix} 0.485714 & 0 & -0.571429 & 0 \\ 0 & 3.61111 & 0 & -3.77778 \\ -0.571429 & 0 & 1.142857 & 0 \\ 0 & -3.77778 & 0 & 4.44444 \end{bmatrix} \begin{bmatrix} \sum_k f_k \\ \sum_k v_k f_k \\ \sum_k v_k^2 f_k \\ \sum_k v_k^3 f_k \end{bmatrix} \quad (7)$$

The symmetric choices for $v_k$ make half of the matrix coefficients zero. This choice of measurement voltages also minimizes the dynamic range involved for the coefficients involved. Since this computation for the $K_i$ terms need only be performed once, and the time constraints are not overly critical (as compared to continuous 104 Msps operation), a single high-precision multiplier combined with the appropriate state-machine may be used to efficiently compute the $K_i$ values with $$M = \begin{bmatrix} C_0 & 0 & C_1 & 0 \\ 0 & C_2 & 0 & C_3 \\ C_1 & 0 & C_4 & 0 \\ 0 & C_3 & 0 & C_5 \end{bmatrix} \quad (8)$$

As given, the $v_k$ voltages will be related to simple powers of 2, thereby making computation of the vector on the right-hand side of equation (7) quite simple to compute by using shift-and-add operations.

$K_i$ Calculation

This section provides a detailed description of an exemplary embodiment including bit-width precisions for determining the $K_i$ terms. Although the computations are shown in a "flattened" format, all of them can be performed in a serial fashion if this will result in a smaller gate count.

A block diagram of a system for determination of the $K_i$ and subsequent $Kn_i$ estimates is shown in FIG. 11 and a system for calculating the $\delta v_k$ values is shown in FIG. 12. Algebraically, the process involved can be more concisely described as follows.

The process for determining the $K_i$ values is described first. Let the frequency deviation measurements given by (4) be represented by $\{fdev_{-1}, fdev_{-1/2}, fdev_{1/2}, fdev_1\}$ at the FM DAC output measurement voltages $\{-1, -\frac{1}{2}, \frac{1}{2}, 1\}$ (Note that the value here are described with respect to $\frac{1}{2}$ of the FM DAC's full scale output range, i.e. normalized). The counter-sums may first be computed as $S_1 = fdev_1 - fdev_{-1}$ $S_2 = fdev_1 + fdev_{-1}$ $S_3 = fdev_{1/2} - fdev_{-1/2}$ $S_4 = fdev_{1/2} + fdev_{-1/2}$ \quad (9)

The bit-precision is driven by the sum for $S_1$. To be conservative, assume that the modulation sensitivity is as high as 200 MHz/V. If the FM DAC's true output voltage range is ±0.50 volt, given $\Delta_F \approx 50$ kHz (33 kHz), $S_1$ could be as large as 3938 (5908) (which requires 14 bits to represent in 2's complement format).

These sums may then be used to compute the next values as $$SV_1 = S_2 + S_4 \quad (10)$$

$$SV_2 = S_1 + \frac{S_3}{2}$$

$$SV_3 = S_2 + \frac{S_4}{4}$$

$$SV_4 = S_1 + \frac{S_3}{8}$$

The required precision here is driven by $SV_1$ and $SV_3$ and in an exemplary embodiment dictates that 18 bits of precision be carried.

The $K_i$ values are then determined as $K_0 = C_0 SV_1 + C_1 SV_3$ $K_1 = C_2 SV_2 + C_3 SV_4$ $K_2 = C_1 SV_1 + C_4 SV_3$ $K_3 = C_3 SV_2 + C_5 SV_4$ \quad (11)

In an exemplary embodiment, the $C_k$ coefficients (as shown in equations 7 and 8) need to be retained with 12 bits of fractional precision, but since the maximum $C_k$ value is 4.4444, a total of 16 bits is required to represent the $C_k$ values in 2's complement form. In addition, the final results for the $K_i$'s may only need to retain 12 significant bits, not including the sign bit. The $K_1$ coefficient will always be the largest (and will also be strictly positive), so may be used for guidance regarding the significant number of bits to be used.

The Ki values may then all be normalized to K1 by using a divide operation. A recursive divide method is shown and described in the VCO linearization algorithm as described later in this document; however, other approaches may also be used.

Once the $Kn_i$ values are determined, they can be used to linearize the 104 Msps stream of $v_k$ values as follows. At the same time, the $G_{FM}$ gain-adjustment term shown in FIG. 6 may be computed as:

$$G_{FM} = \frac{K_{Desired}}{K_1} \quad (12)$$

In an exemplary embodiment, the gain adjustment range for $G_{FM}$ shall be set from 0.75 to unity in 9U9 format as shown in FIG. 11.

Linearizing the VCO Modulation Port Using the $Kn_i$ Values

Once the $Kn_i$ polynomial coefficients have been determined, the modulation correction polynomial that is used within the IQC may be determined. This correction polynomial may then be used to linearize the modulation port's tuning characteristic.

With the pre-correction polynomial in place, the modulation characteristic of the VCO would ideally be linear with a tuning sensitivity of $Kn_1$ (It is noted that only linearization is being sought here. The $G_{FM}$ gain-adjustment parameter may be applied separately such that $K_1 G_{FM}$ delivers the desired FM linear port tuning gain of $Kn_1$.) This is illustrated with respect to the equation $$Kn_1 v = Kn_0 + Kn_1 vc + Kn_2 vc^2 + Kn_3 vc^3 \quad (13)$$

where vc represents the modulation voltage after correction as it would be applied to the VCO's modulation port. In the interest of simplicity, vc may be given by $$vc = \alpha_0 \alpha_1 v + \alpha_2 v^2 + \alpha_3 v^3 \quad (14)$$

The approximate solution to this cubic equation may be found by assuming that the amount of correction to the original voltage v is small, thereby making the approximation $$vc \approx v + \delta v \quad (15)$$

Substituting (15) into (13) and retaining only the first-power of $\delta v$ leads to a solution $$\delta v = \frac{Kn_0 + Kn_2 v^2 + Kn_3 v^3}{Kn_1 + 2Kn_2 v + 3Kn_3 v^2} \quad (16)$$

This has been shown to lead to desirable results. The required division operation yields very nicely to the recursive solution described below.

A division algorithm may be based on the auxiliary function f(x) given by $$f(x) = \frac{1}{x} - b \quad (17)$$

where the solution is the reciprocal of b. If the reciprocal of the denominator portion in (16) is computed, the rest of the computation in (16) is trivial. The Newton-Raphson algorithm provides an iterative means to solve (17) as $$x_{i+1} = x_i - \frac{f(x_i)}{f'(x_i)} \quad (18)$$

Having chosen the auxiliary function in this way (equation 17), $f'(x) = -1/x^2$. Substitution of this result and (17) into (18) provides the recursive solution as $$x_{i+1} = x_i(2 - bx_i) \quad (19)$$

The initial value of b may first be scaled so that it lies between 0.50 and 1.0 (positive number example given here), resulting in rapid convergence. Some exemplary edge-case examples illustrate the quadratic convergence property of this recursive algorithm as shown in Table 2 below. In both cases, only 4 iterations are required to achieve 10 decimal place accuracy. The initial starting solution for both cases was taken to be the geometric center of the possible solution space, $\sqrt{2}$.

TABLE 2

Example Recursive Solutions for 1/b

| Iteration | $x_i$ for b = 0.603 | $x_i$ for b = 0.913 |
|---|---|---|
| 0 | 1.414 | 1.414 |
| 1 | 1.62236 | 1.00255 |
| 2 | 1.657592 | 1.087438 |
| 3 | 1.658374 | 1.095234 |
| 4 | 1.658374 | 1.0952903 |

Determining the $\delta v_k$ Values

An embodiment of a system for performing the $\delta v_k$ calculations is shown in FIG. 11. These computations are typically performed at the full sampling rate, for example at 104 Msps rate in an exemplary embodiment.

It is noted that Kn1 (=1) in the denominator of (16) dwarfs the other polynomial coefficients present. The scaling involved is shown in FIG. 11 as the value "pow2" and the scaling is a power-of-2 factor. Since the $\delta v_k$ quantity is computed as a ratio in equation (16), the same scaling factor (i.e., number of shifts) should be applied to the numerator term as also shown in FIG. 11. In this embodiment, the maximum useable range for $\delta v_k$ will be ±0.25 volts when vk spans ±1 volt.

In some embodiments, the recursive divide algorithm in equation (19) may be applied 3 times consecutively as shown in FIG. 11 to insure sufficient precision. As described previously, the initial solution x0 may be assumed to be $\sqrt{2}$. As a result, the b parameter in FIG. 11 will always be positive for useful systems, whereas the xk values may take on either sign.

Figure 13:
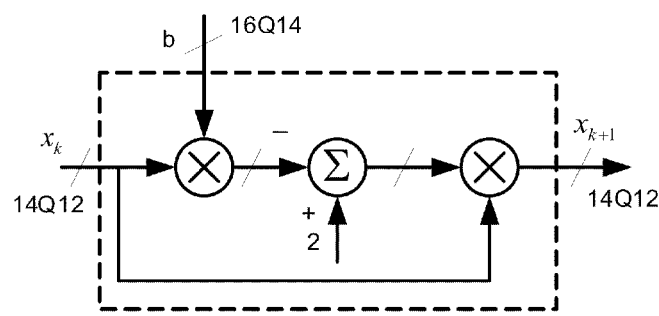
FIG. 13 illustrates an embodiment of a recursive divide step.

A block diagram of an embodiment of a system performing the "Div Iteration" shown in FIG. 12 is illustrated in FIG. 13. This same functional block is represented in FIG. 11 by the "K-Div Iteration" blocks shown at the bottom of the figure. These blocks may be physically implemented using an iterative process with one core block, whereas the operations in FIG. 12 will typically be pipelined owing to the much greater computational speed required.

$G_{FM}$ Calculation

An embodiment of a system for $G_{FM}$ calculation is shown in FIG. 11. The parameter $K_{desired}$ represents the desired linear VCO gain expressed as a 22Q3 value. In this format, 1 LSB represents 4.23177 kHz/LSB when $T_{meas}$=29.54 μs. (for a measurement time interval of (768/26=29.538) μs, a VCO tuning sensitivity of 20 MHz/V would correspond to a value of approximately 4726).

The IQC may be set up to use a range of different $K_{FM}$ values, such as those shown in Tables 6-9 of Appendix A. The measured $K_1$ value from equation (11) may be compared to the threshold values given in Table 3 below (column 2 or 4 depending on $T_{meas}$) and a 2-bit code returned to the IQC so that it knows which $K_{desired}$ value to use. The IQC then returns that $K_{desired}$ value to the $K_{FM}$ calibration routine to use in computing $G_{FM}$. The $K_{FM}$ calibration routine may receive the $K_{desired}$ value from the IQC rather than determining it independently to reduce the possibility of an error being made, and also because the $K_{desired}$ value can be programmed manually via a serial programming interface.

Because the IQC typically doesn't know what the measurement time interval is, it will always return the $K_{desired}$ value corresponding to a predefined measurement time [for example, the 512/(26 MHz) measurement time]. If the true measurement time is 768/(26 MHz) then the $K_{desired}$ returned by the IQC must be multiplied by 3/2.

For example, if a value for $K_1$ is computed using equation (11) to be 1525 using a measurement time of 19.69 μs, this result is less than the value 1550 in column 2 row 2 but greater than the value 1277 in column 2 row 1, so an IQC Code=1 would be returned to the IQC. As long as the system has not been programmed to override the $K_{desired}$ value, the IQC would then return a $K_{desired}$ value of 1550 to the $K_{FM}$ calibration routine.

TABLE 3

$K_{desired}$ Values Versus $K_1$ and Measurement Time Interval
[Calculated as floor(4 $K_1$ $T_{meas}$ + 0.50)]

| $K_1 \leq$ MHz/V | $T_{meas} = 512/(26\ MHz)$ | | $T_{meas} = 768/(26\ MHz)$ | |
|---|---|---|---|---|
| | Computed $K_1$ Equation (9) $\leq$ | IQC Code | Computed $K_1$ Equ. (9) $\leq$ | IQC Code |
| 16.21 | 1277 | 0 | 1916 | 0 |
| 19.67 | 1550 | 1 | 2325 | 1 |
| 26.23 | 2066 | 2 | 3099 | 2 |
| 67.82 | 5342 | 0 | 8013 | 0 |
| 90.43 | 7123 | 1 | 10685 | 1 |
| 135.6 | 10684 | 0 | 16026 | 0 |
| 180.8 | 14242 | 1 | 21363 | 1 |

Applying Gain and Integrating Quantization Error

Figure 14:
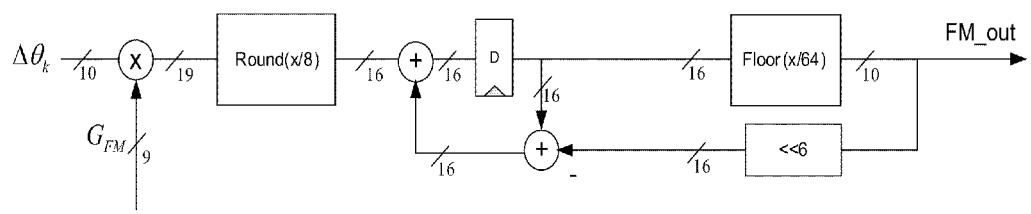
FIG. 14 illustrates an embodiment of a quantization error integration circuit.

In some embodiments, when multiplying by the gain correction factor $G_{FM}$ phase should be preserved. This may require special attention for GSM embodiments where the incoming FM values can be as small at +/−12 LSBs and the quantization error introduced by the multiplication can be a significant fraction of the absolute value. To preserve the phase, an integrating block similar to the FM limit and round block used in the IQ converter may be used; however, with a simpler configuration and with a feedback component only. An embodiment of this circuit is illustrated in FIG. 14.

KFMC Performance for WCDMA Systems

In tests of several implementation, VCO modulation port linearization using embodiments of the correction systems and methods described herein has shown to be effective compared to no correction, even when the VCO tuning nonlinearities are substantial. The correction computed using equation (16) is nevertheless an approximate solution to the cubic equation (14), so when the correction voltage δv has a magnitude greater than roughly 50 to 100 mV (compared to ±1 FM DAC full-scale output), the linearization error at 4 GHz may increase beyond 0.5% at the extremes of the modulation voltage range. Without this correction, the error can be as large as 10% or more at these same modulation voltage extremes.

Some initial Monte-Carlo type analyses were conducted to explore the VCO standalone linearity requirements needed. These results are shown in Appendix A Section 3.2. In all cases considered, the greatest source of performance loss when the processing methods were pushed to the limit was a combination of (a) frequency counter count-error, (b) insufficient FM DAC voltage swing to fully linearize the tuning characteristic near the ±1 V extremes, and (c) inadequate precision in the approximate solution given by equation (16) [Precision here refers to the accuracy of the approximation itself rather than any bit-width issues. This is because equation (16) provides a first-order approximation to the cubic equation's solution rather than an exact solution]. The curve-fit accuracy remained tight regardless of the VCO tuning characteristic considered and in general is not affected by the VCO's characteristics.

In some embodiments, performance of the linearizer may be improved if the modulation-port voltage offset can be removed accurately after the FM DAC. This returns the observed FM tuning curve to a more symmetric condition which may be desirable. Otherwise, considerable linearization range may be unnecessarily lost. Post FM-DAC removal of the dc offset may be implemented as shown in FIG. 6.

$K_{FM}$ Gain Adjustments

When $K_{FM}$ related processing has been completed, the correction voltage given by equation (16) may be added in the signal path immediately prior to the FM DAC to perform the correction. In some embodiments correction may need to be applied so that the FM DAC output can be "filled up" by the modulation signal. If the scaling is done incorrectly, one or more bits of quantization could be lost at the FM DAC.

Small $K_{FM}$ gain changes (primarily $K_1$) may be handled digitally within the IQC using the $G_{FM}$ gain parameter. The VCO may undergo a process calibration to bring its linear $K_1$ tuning sensitivity to within a fixed range, for example 15%, of its correct value.

KFMC-Track-Mode Calibration (WCDMA Modes)

As described previously, the initial KFMC calibration result is expected to perform well, but it is possible that the VCO's modulation characteristic (denoted by the $K_i$ values) will change over time based on circuit parameters, temperature, and the like. This presents potential difficulty for embodiments operating in a WCDMA mode used in a continuous-time manner. The following track mode calibration is intended to provide a low-bandwidth approach to track the slowly varying changes in the $K_i$ that may result in WCDMA mode.

The track mode takes advantage of correlation properties between the PLL's loop filter control voltage and a properly processed signal that is created in the IQC to measure how closely the VCO impressed FM modulation matches the precise FM modulation that is inserted by the SDM. If there is little or no mismatch between these two signal functions, very little "modulation correction" will pass through the PLL and the correlation measurement will be negligible. The converse makes this technique capable of providing an error metric that can be used to continuously optimize the $K_i$ coefficients even in the presence of normal WCDMA transmit operations.

The KFMC Track Mode (KFMC-TM) is intended to be used in connection with WCDMA operation, however, it may be possible to use it with other modes as well. It is intended to fill in the gap between the KFMC-IC $K_i$ estimates and how these may evolve over an extended amount of time when another KFMC-IC cannot be performed. As such, the algorithm's bandwidth is typically a relatively non-critical item.

KFMC-TM High-Level Requirements

A summary of the high-level requirements for an embodiment of the KFMC-TM function is provided below in Table 4.

TABLE 4

Summary of High-Level Requirements for one Embodiment of KFMC Track Mode

| Parameter | Value | Comments |
|---|---|---|
| Parameters Being Optimized | $K_i$, i = 0 . . . 3 | |
| Parameter Format | 13Q12 | All are normalized with respect to $K_1$ making $K_1$ = 1 |
| Optimization Type | Random Search | Most important $K_i$ values are searched more frequently. |
| Error Metric Type | Correlation | |
| Dwell Time per Metric Evaluation | 50-500 μs | Programmable in roughly 50 μs steps |
| Error Metric Inaction Threshold (EMIT) | Adjustable | Error level below which no corrections are made to the $K_i$ values |

TABLE 4-continued

Summary of High-Level Requirements for one Embodiment of KFMC Track Mode

| Parameter | Value | Comments |
|---|---|---|
| Duty Cycle for Algorithm Execution | Programmable | 0, 1/8192, . . ., 1/2, 1 Measured in terms of Dwell Time units |
| Maximum VCO Control Port Modulation Sensitivity | 50 MHz/V | Directly impacts error metric precision attainable |

KFMC-TM Overview

According to one embodiment, the basic elements of the KFMC-TM processing are shown in FIG. 6 as the unshaded blocks. If the VCO's modulation port were perfectly linear and all of the processing involved with the IQC equally ideal, the polar phase modulation impressed on the VCO would be exactly equal to the phase removed by the sigma-delta modulator in the feedback path (at least within Nyquist limits). Under these circumstances, the PLL would "see" no modulation phase error at the phase detector and the phase portion of the polar processing would be ideal; however, in actual systems this is typically not the case.

The VCO's modulation port does not have a perfectly linear tuning characteristic. Not only may it contain second and third-order terms as in equation (5), but the precise value of even the linear term K1 may not be known a priori.

The KFMC-IC step will perform a good estimate of the Ki parameters, but as already mentioned above, these values may well change over time, voltage, temperature, and the like before the system has another opportunity to perform another KFMC-IC step in WCDMA mode.

Ideally, the KFMC-TM processing system seeks to minimize the phase error variance at the TxPLL's phase detector output by adjusting the Ki values since this would mean that the output phase from the TxPLL θo is matching the phase modulation imposed by the SDM OSDM very accurately. This is more easily described than implemented, however, because there may be a very substantial phase variance term present due to the fractional-N SDM operation alone, even without modulation applied. Furthermore, the phase information at the phase detector may only be available in terms of very minute time-of-arrival differences for the digital divider's output. For at least these two reasons it may be intractable to formulate an error metric directly at the TxPLL phase detector output.

However, the VCO's control port voltage as shown in FIG. 15 may be available in some embodiments to provide a clean, continuous signal. Since it is a linear transformation of the phase error process as well as being band-limited, this may be a much more attractive signal to use for the processing algorithm's error metric. If the VCO's impressed modulation precisely matches the phase being impressed by the SDM, then the variance of the VCO's control port voltage will approach zero.

In order to form an error metric for the optimization algorithm, the variance of the Vd voltage could be computed. The average of Vd is otherwise zero. The variance of Vd would, however, include variance terms from the normal unmodulated SDM operation as well as due to modulation-related errors. Cross-correlating $V_d$ with an appropriate signal may be used to provide a great deal of discrimination capability, thereby amplifying the sensitivity of the error metric substantially. One embodiment of this signal correlation is described in the following section.

Signal Correlation

Signal correlation processing may require a fairly complex system if good performance is to be achieved. Some of the most egregious VCO tuning imperfections occur for large impulse-like voltage functions at the VCO's modulation port, whereas the band-limited voltage available for use (shown as $V_d$ in FIG. 15) will have a dramatically different time-function characteristic. In the linear system sense, this can all be determined in the IQM.

VCO-related tuning nonlinearities as observed at $V_d$ will typically bear a strong resemblance (i.e., be highly correlated) to the signal given by $$vx(t) = \int v_t(\tau)h(t-\tau)d\tau \quad (20)$$

where $v_t(t)$ is the signal voltage applied to the modulation port of the VCO and h(t) is the impulse response whose Laplace transform is H(s) where $$H(s) = \frac{L[V_d(t)]}{L[v_t(t)]} \quad (21)$$

The symbol L denotes the forward Laplace transform operation in (21). In other words, H(s) is simply the linear transfer function between $v_t(t)$ and $V_d(t)$ in FIG. 15.

The signal correlation that provides a convex well-behaved error metric $\epsilon$KFM can be determined by the processing as shown in FIG. 15 as follows:

1. The ideal instantaneous FM values within the IQC (normally denoted by $\Delta\theta_k$ in the IQC terminology, at 104 Msps) are digitally processed through the digital equivalent of H(s), denoted by H(z) here.
2. The output from H(z) in the IQC is hard-limited in the time domain to output voltage values corresponding to ±1. Denote this hard-limited output by $v_{corr}(t)$.
3. The VCO control port voltage denoted by $V_d$ in FIG. 15 must be passed through a highpass filter in order to remove any dc components present. Denote the output voltage from this highpass filter as $v_{hpf}(t)$.
4. Signals $v_{hpf}(t)$ and $v_{corr}(t)$ are multiplied (i.e., cross-correlated) and the multiplier output accumulated in an analog integrate-and-dump block to create $\epsilon_{KFM}$ which is an analog representation of the error metric sought.

In some embodiments there may be important parameters that may apply to the analog circuitry associated with the error metric measurement system shown in FIG. 15. These are summarized below in Table 5.

TABLE 5

Mixed-Signal $K_{FM}$ Error Metric Circuitry High-Level Requirements For Some Embodiments

| Parameter | Value | Comments |
|---|---|---|
| Highpass Filter Corner Frequency | ≦25 kHz | −3 dB corner frequency. Two 20 pF capacitors and 640 kΩ in differential configuration. |
| Gpre Gain Block | | Helpful to have voltage gain after the HPF |
| Voltage Gain Before Correlator | | dc blocking, but before correlator input. |
| Low-frequency Limit | 10 kHz | |
| High-frequency Limit | 5 MHz | |
| Input-Referred DC Offset | ±5 mV | |
| Correlator Inputs | | Accepts Δ-Σ DAC inputs toggling at up to 13 MHz rate. |
| Hard-Limited Input $F_L$ | ≦25 kHz | |

TABLE 5-continued

Mixed-Signal $K_{FM}$ Error Metric Circuitry High-Level Requirements For Some Embodiments

| Parameter | Value | Comments |
|---|---|---|
| $F_H$ Highpass Filter Output | $\geq 40$ MHz | Low frequency cut-off High frequency cut-off. |
| $F_L$ | $\leq 25$ kHz | Low frequency cut-off |
| $F_H$ Input-Referred DC Offset | $\geq 3$ MHz | High frequency cut-off |
| Integrate-and-Dump Input-Referred DC Offset | 200 μs | |
| Output Voltage Range | ±5% | $\tau_{ID}$ |
| Integration Time Constant | <0.1% per rip | Not critical |
| Time Constant Precision Voltage Droop | | |

H(z) Formulation

If the TxPLL were a classical type-2 second-order PLL, the transfer function H(s) would be given by $$H(s) = \frac{\omega_n^2}{s^2 + 2\zeta\omega_n s + \omega_n^2} \quad (22)$$

where $\zeta$ is the loop damping factor and $\omega_n$ is the loop natural frequency.

Equation (22) can be converted to a z-transform format that can be implemented within the IQC. Since the output of the filter is fairly narrowband compared to the sample rate of 104 Msps, the $\Delta\theta_k$ values that are computed in the IQC may first be passed through a CIC digital filter and down-sampled by a factor of 8 to reduce power consumption. Following this step, the conversion of (22) into H(z) can be done using a bilinear transform. Substituting $s \cong 2\,T^{1}\,(z-1)/(z+1)$ into (22) provides the result as $$H(z) = \frac{(\omega_n T)^2 (1+z)^2}{z^2[4+4\zeta\omega_n T + (\omega_n T)^2] + z[2(\omega_n T)^2 - 8] + [4 - 4\zeta\omega_n T + (\omega_n T)^2]} \quad (22)$$

and in this result, $T=(13\ \text{MHz})^{-1}$. These steps are shown schematically in FIG. 16. A simplified form for equation (23) is given by $$H(z) = \frac{a_0 (1+z)^2}{b_2 z^2 + b_1 z + b_0} \quad (24)$$

Coefficient values for the described PLL bandwidth cases are shown below in Table 6. For actual digital implementation purposes, it may be more convenient to re-write equation (24) as $$y_k = c_0[x_k + 2x_{k-1} + x_{k-2}] - c_1 y_{k-1} - c_2 y_{k-2} \quad (25)$$

where:

$$c_0 = \frac{a_0}{b_2} \quad (26)$$

$$c_1 = \frac{b_1}{b_2}$$

$$c_2 = \frac{b_0}{b_2}$$

In hardware embodiments, the $\omega_n$ and $\zeta$ values in equation (23) should not be implemented exhaustively; it will suffice to save the denominator polynomial coefficients for only a few choices of $\omega_n$ and $\zeta$ as shown in Table 6. The three right-hand columns of Table 6 have been further simplified for digital implementation purposes in Table 7.

TABLE 6

H(z) Configuration Settings for Hardware Implementations

| H(z) Parameter Setting Index | $\omega_n/2\pi$ kHz | $\zeta$ | Starting Values | | | | DSP Implem. | | |
|---|---|---|---|---|---|---|---|---|---|
| | | | $a_0$ | $b_2$ | $b_1$ | $b_0$ | $c_0$ | $c_1$ | $c_2$ |
| 0 | 50 | 0.50 | 0.000584 | 4.049 | −7.999 | 3.952 | 0.0001442 | −1.976 | 0.976 |
| 1 | 50 | 0.707 | 0.000584 | 4.069 | −7.999 | 3.932 | 0.0001435 | −1.966 | 0.966 |
| 2 | 100 | 0.50 | 0.002336 | 4.099 | −7.995 | 3.906 | 0.0005699 | −1.951 | 0.953 |
| 3 | 100 | 0.707 | 0.002336 | 4.139 | −7.995 | 3.866 | 0.0005644 | −1.932 | 0.934 |
| 4 | 150 | 0.707 | 0.0005256 | 4.210 | −7.989 | 3.800 | 0.001248 | −1.898 | 0.903 |
| 5 | 200 | 0.707 | 0.009344 | 4.283 | −7.981 | 3.736 | 0.002182 | −1.864 | 0.872 |
| 6 | 250 | 0.50 | 0.015 | 4.256 | −7.971 | 3.773 | 0.00343 | −1.873 | 0.886 |
| 7 | 250 | 0.707 | 0.015 | 4.356 | −7.971 | 3.673 | 0.003351 | −1.83 | 0.843 |

TABLE 7

Fractional Form for DSP Implementation from Table 6

| H(z) Parameter Setting Index | $\omega_n/2\pi$ kHz | $\zeta$ | $c_0$ | $c_1$ | DSP Implementation ($_{Numerical\ format\ example\ 1.01101 = 1 + 1/4 + 1/8 + 1/32}$) $c_2$ |
|---|---|---|---|---|---|
| 0 | 50 | 0.50 | $2^{-13} \times 1.0011$ | $-2 + 0.0000011$ | $1 - 0.0000011$ |
| 1 | 50 | 0.707 | $2^{-13} \times 1.001011$ | $-2 + 0.00001$ | $1 - 0.00001$ |
| 2 | 100 | 0.50 | $2^{-11} \times 1.0010101$ | $-2 + 0.000011$ | $1 - 0.000011$ |
| 3 | 100 | 0.707 | $2^{-11} \times 1.00101$ | $-2 + 0.0001$ | $1 - 0.0001$ |
| 4 | 150 | 0.707 | $2^{-10} \times 1.01001$ | $-2 + 0.00011$ | $1 - 0.00011$ |
| 5 | 200 | 0.707 | $2^{-9} \times 1.001$ | $-2 + 0.001$ | $1 - 0.001$ |
| 6 | 250 | 0.50 | $2^{-9} \times 1.11$ | $-2 + 0.001$ | $1 - 0.001$ |
| 7 | 250 | 0.707 | $2^{-9} \times 1.10111$ | $-2 + 0.00101$ | $1 - 0.00101$ |

Figure 20:
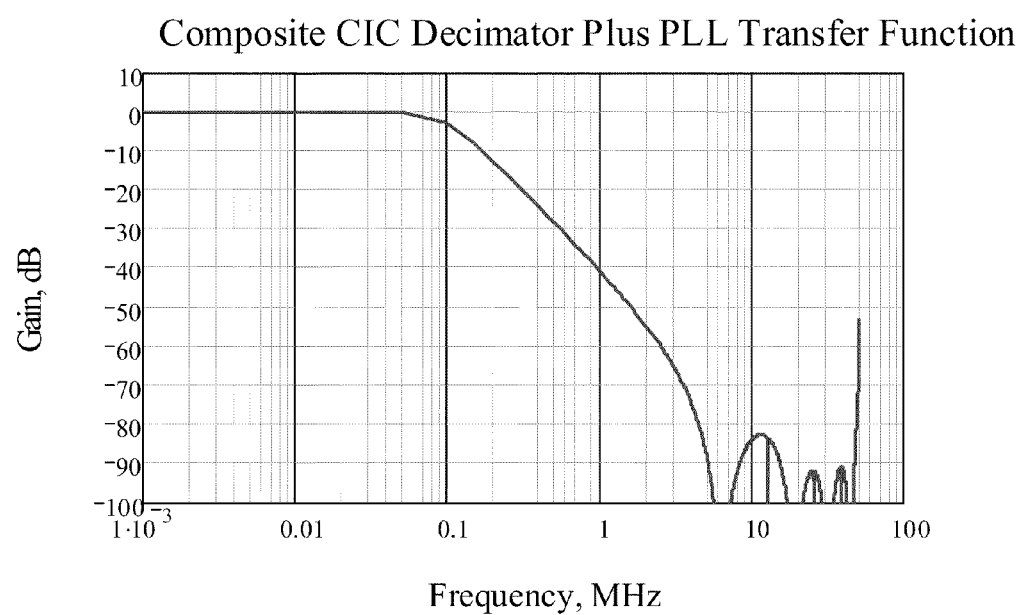
FIG. 20 illustrates the transfer function of a composite CIC lowpass filter/decimator with PLL.

Additional details for an embodiment of a CIC LPF/decimator are illustrated in FIG. 17. It is assumed that the same precision available at the input to the decimator is maintained through processing steps to the output. This arrangement exhibits the frequency-domain transfer function shown in FIG. 19. The composite result of the CIC lowpass filter and PLL transfer function is shown in FIG. 20 for one specific PLL bandwidth configuration.

Analog Correlation Circuitry

Figure 21:
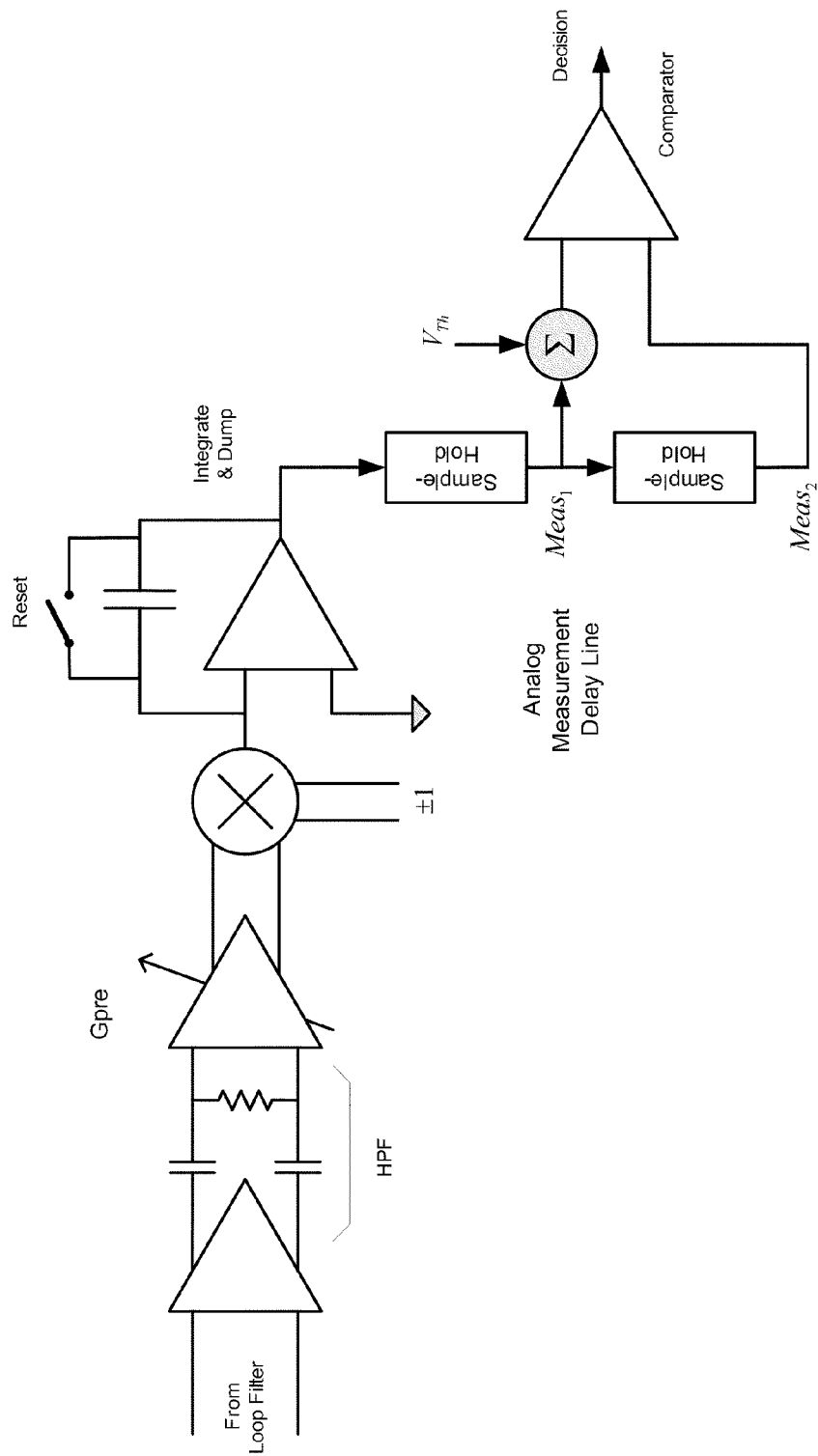
FIG. 21 illustrates an embodiment of analog cross-correlation circuitry.

An expanded view of one embodiment of the analog correlation circuitry as shown in FIG. 15 is illustrated in FIG. 21. The inputs to the circuit shown in FIG. 21 touch the TxPLL's loop filter which is an extremely sensitive area of the circuitry. In order to avoid impairing performance, virtually no noise should be induced into the TxPLL's loop filter by the addition of this new circuitry. The input impedances must also be high enough so that they do not "bleed" any charge from the loop filter. The highpass filter is intended to block dc. An exemplary corner frequency is specified in Table 5. The adjustable gain block $G_{pre}$ may or may not be required depending on (i) the VCO's control port tuning sensitivity and (ii) the dc offset voltage that can be realized at the correlator's input. The integration time for the integrate & dump is specified in Table 5, as well as leakage, and other parameters. The two-stage analog delay line is used to compare consecutive error metric measurements one pair at a time. The first measurement in each pair (Meas$_2$) corresponds to the error metric measured for the present "golden" $K_i$ settings. The second measurement in each pair (Mea$_1$) is the error metric measured for a hypothetical improved $K_i$ setting. If the hypothetical $K_i$ case results in a better error metric, it is accepted as the "golden" setting and the process is repeated. Although this dithering approach requires that the "golden" settings be re-evaluated for every pair, the technique avoids the need for an ADC. $V_{Th}$ is used to insure that $K_i$ settings are not accepted when the error metrics being compared are virtually the same. Some adjustability is needed for $V_{Th}$, but a DAC is purposely to be avoided.

Optimization Search Strategy

In exemplary embodiments, the optimization search strategy is purposely made as simple as possible. At present, there are no speed constraints imposed upon the processing algorithm because it is important that a good set of solutions initially provided by KFMC-IC not be erroneously abandoned due to unreliable decisions made during the search strategy.

Figure 22:
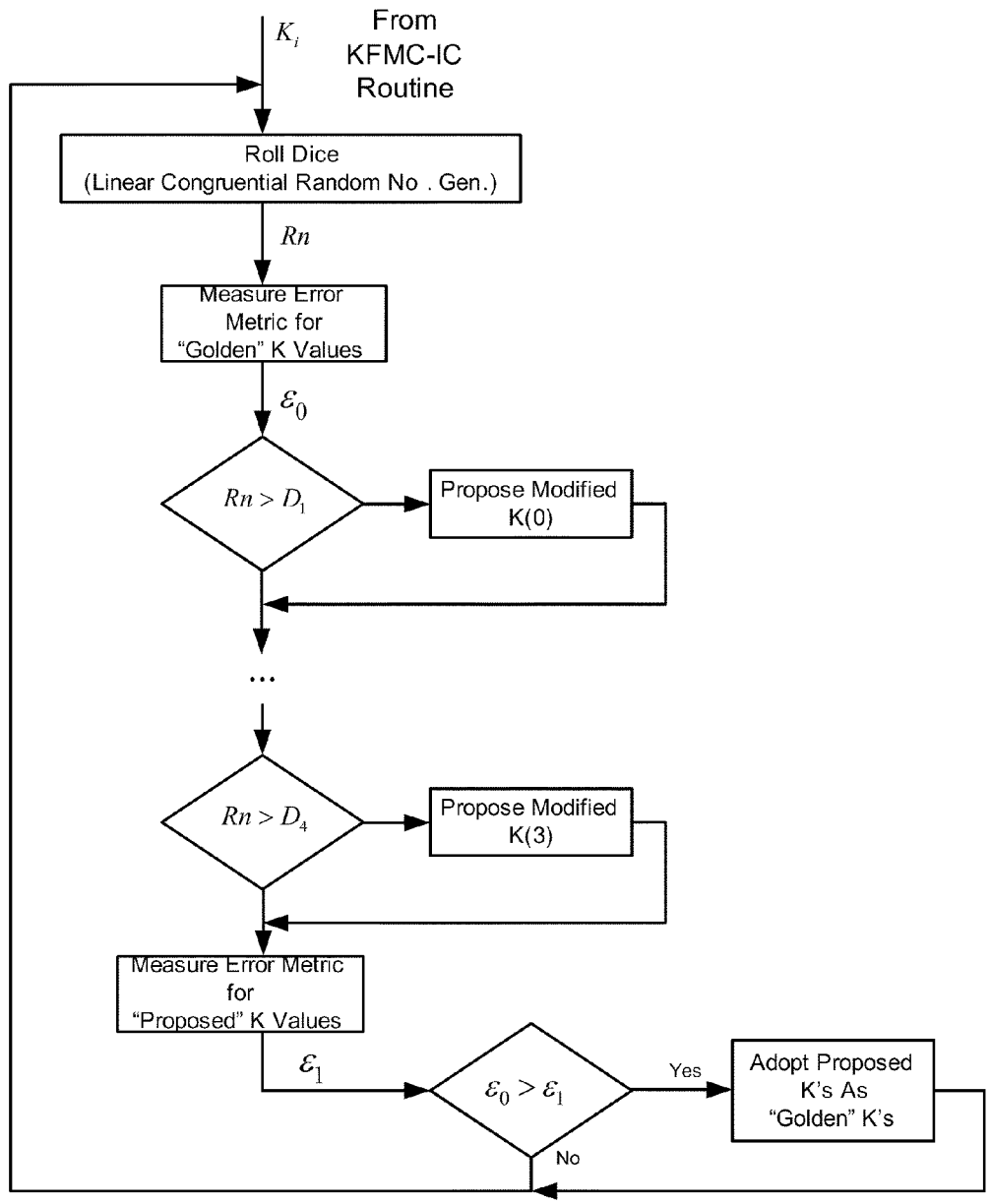
FIG. 22 illustrates an embodiment of a process for an optimized search strategy.

A flowchart of an embodiment of a simplified search strategy algorithm is shown in FIG. 22. Two sets of VCO parameters are used: (1) the "golden" $K_i$ values that are initially provided by the KFMC-IC routine, and (2) a "proposed" set of new $K_i$ values. The proposed set of new $K_i$ values is assembled based on (a) a random number generator value plus decision thresholds $D_k$ that dictate whether a polynomial coefficient will be trial-adjusted or not, and (b) the $dK_i$ values that are pre-determined small adjustment values that are programmed into the RFIC. Setting the $i^{th}$ decision threshold $D_i$ near the maximum possible random number generator value will result in the associated polynomial coefficient being trial-adjusted very infrequently.

The choices for the $dK_i$ may be particularly important. If the adjustment sizes are too large, the VCO linearization will be adversely impacted and performance degraded when new trial K-values are tried. If the sizes are too small, the test for an improved error metric will never succeed and no $K_{FM}$ calibration tracking will in fact occur. The correct values for the $dK_i$ can only be determined by simulation once the other key hardware elements have been designed (i.e., VCO tuning characteristic, known dc offset voltages, etc.). A high-level summary of the parameters associated with one embodiment of the process shown in FIG. 22 is provided below in Table 8.

TABLE 8

Summary of Search Strategy Parameters Corresponding to the Process of FIG. 22

| Parameter | Min | Max | Comments |
|---|---|---|---|
| Random Number Generator Bit Width | 10 | | 1-stage linear congruential type |
| Decision Thresholds | | | Scaled up by $2^5$ to match random number generator MSBs |
| Quantity | 4 | | |
| Individual Bit Width | 5 | | |
| $dK_i$ | | | Programmable |

Simulation Results on Tracking Mode (KRMC-TM)

Simulations were performed modeling KFMC-TM. The primary purpose of the simulations was to investigate the convexity properties of the error metric surface. Without the convexity property, the track-mode calibration may be impractical due to implementation complexity. Many different simulation cases were run with different VCO nonlinear tuning characteristics. In all cases considered, the error metric error surface exhibited convexity as desired.

The methods and apparatus described herein are provided with respect to particular embodiments, however, those skilled in the art can readily recognize that numerous variations and substitutions may be made in the invention, its use and its configuration to achieve substantially the same results as achieved by the embodiments described herein. Accordingly, there is no intention to limit the invention to the disclosed example embodiments. Many variations, modifications and alternative constructions fall within the scope and spirit of the disclosed invention and are fully contemplated herein.

It is noted that in various embodiments the present invention may relate to processes such as are described or illustrated herein. These processes and associated apparatus are typically implemented in one or more modules, and such modules may include computer software stored on a computer readable medium including instructions configured to be executed by one or more processors. It is further noted that, while the processes described and illustrated herein may include particular steps or stages, it is apparent that other processes including fewer, more, or different stages than those described and shown are also within the spirit and scope of the present invention. Accordingly, the processes shown herein are provided for purposes of illustration, not limitation.

As noted, some embodiments of the present invention include computer software and/or computer hardware/software combinations configured to implement one or more processes or functions associated with the present invention. These embodiments may be in the form of modules implementing functionality in software and/or hardware software combinations. Embodiments may also take the form of a computer storage product with a computer-readable medium having computer code thereon for performing various computer-implemented operations, such as operations related to functionality as described herein. In some embodiments, the media and computer code may be those specially designed and constructed for the purposes of the present invention, or in others they may be of the kind well known and available to those having skill in the computer software arts, or they may be a combination of both.

Examples of computer-readable media within the spirit and scope of the present invention include, but are not limited to: magnetic media such as hard disks; optical media such as CD-ROMs, DVDs and holographic devices; magneto-optical media; and hardware devices that are specially configured to store and execute program code, such as programmable microcontrollers, application-specific integrated circuits ("ASICs"), programmable logic devices ("PLDs"), ROM and RAM devices, as well as other programmable or programmatically pre-configured electronic devices. Examples of computer code may include machine code, such as produced by a compiler or other machine code generation mechanisms, scripting programs, PostScripts programs, and/or other code or files containing higher-level code that are executed by a computer using an interpreter or other code execution mechanism. Other examples of code may be code burned in or otherwise programmed into hardware devices such as in ROM, PROM or EPROM, ASIC devices, programmable logic devices, or other programmable devices.

In various embodiments, computer code may be comprised of one or more modules executing a particular process or processes to provide useful results, and the modules may communicate with one another via means known or developed in the art. For example, some embodiments of the invention may be implemented using DSP languages, assembly languages, Java, C, C#, C++, scripting languages, and/or other programming languages using associated software development tools as are known or developed in the art. Other embodiments of the invention may be implemented in hard-wired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. Apparatus for calibrating the gain of a voltage controlled oscillator (VCO) in a phase-locked loop (PLL), comprising:
   tuning characteristic measurement logic to measure a tuning characteristic of the VCO;
   tuning model generation logic to generate a tuning model based on the tuning characteristic; and
   correction generation logic to generate a correction signal based on the tuning model;
   wherein the tuning characteristic measurement logic to measure a tuning characteristic comprises logic to determine a set of open loop frequency characteristics of the VCO at ones of a plurality of applied test frequencies.

2. The Apparatus of claim 1 wherein the tuning model generation logic to generate a tuning model comprises logic to generate a polynomial tuning model based on the set of open loop frequency characteristics.

3. The Apparatus of claim 2 wherein the polynomial is a cubic polynomial.

4. Apparatus for calibrating the gain of a voltage controlled oscillator (VCO) in a phase-locked loop (PLL), comprising:
   tuning characteristic measurement logic to measure a tuning characteristic of the VCO;
   tuning model generation logic to generate a tuning model based on the tuning characteristic;
   correction generation logic to generate a correction signal based on the tuning model; and
   logic to:
   apply the correction signal to a VCO input signal to generate a calibrated VCO input signal; and
   couple the calibrated VCO input signal to a modulation port of the VCO.

5. The Apparatus of claim 4 wherein the correction signal is generated as a digital signal.

6. The Apparatus of claim 5 wherein the correction signal comprises in phase (I) and quadrature (Q) components.

7. Apparatus for calibrating the gain of a voltage controlled oscillator (VCO) in a phase-locked loop (PLL), comprising:
   tuning characteristic measurement logic to measure a tuning characteristic of the VCO;
   tuning model generation logic to generate a tuning model based on the tuning characteristic; and
   correction generation logic to generate a correction signal based on the tuning model;
   wherein the tuning characteristic measurement logic to measure the tuning characteristic comprises:
   a voltage generator configured to generate a set of digital test frequency signals corresponding to a plurality of open loop frequencies to be applied to the VCO;
   a frequency modulation digital to analog converter (DAC) configured to convert the digital frequency test signals to an analog test frequency signal;

a low pass filter (LPF) coupled to the DAC and the VCO to filter the analog test frequency signal; and a coarse tuning and frequency measurement state machine coupled to the VCO, said state machine configured to measure a set of open loop frequencies provided by an output of the VCO and store the set of open loop frequency measurements in correspondence with the set of voltage test signals.

8. The Apparatus of claim 7 wherein the state machine comprises a frequency counter coupled to the VCO output.

9. The Apparatus of claim 8 further comprising an auxiliary frequency counter coupled to the VCO and the state machine.

10. The Apparatus of claim 7 wherein the state machine includes least square error curve fitting logic to generate the tuning model.

11. The Apparatus of claim 7 wherein the state machine includes logic to solve the Vandermode equation for a set of n measurements to generate the tuning model.

12. The Apparatus of claim 11 wherein n equals 5.

13. The Apparatus of claim 11 wherein a set of vk coefficients used in the Vandermode equation are selected so as to be symmetric to improve calculation efficiency.

14. A method of operating a phase-locked loop, comprising:
    determining a set of adjustment values for use in linearizing the gain tuning characteristics of a VCO component of the phase-locked loop;
    combining the adjustment values with a frequency modulation signal to generate a calibrated frequency modulation signal; and
    applying the calibrated frequency modulation signal to a VCO modulation port;
    wherein the determining a set of adjustment values comprises:
    applying, at ones of a plurality of test frequency levels, ones of a corresponding plurality of frequency test signals to the VCO modulation port;
    allowing the VCO output frequency to settle;
    resetting a frequency counter coupled to a VCO output;
    enabling the frequency counter for a predefined time duration;
    reading the frequency counter count value after expiration of the predefined time duration so as to generate a set open loop frequency test data; and
    storing the frequency test data and the corresponding test frequency levels.

15. The method of claim 14 further comprising generating, based on the test frequency levels and corresponding frequency test data, the set of adjustment values.

16. A method of calibrating the gain of a VCO, comprising:
    configuring the VCO in an open-loop configuration;
    applying ones of a plurality of frequency test signals to the VCO to generate a corresponding set of VCO tuning characteristics;
    generating a VCO tuning model based on the VCO tuning characteristics; and
    generating a VCO correction signal based on the VCO tuning model.

17. The method of claim 16 further comprising:
    generating a calibrated VCO input signal by combining the VCO correction signal and a VCO input signal; and
    providing the calibrated VCO input signal to a modulation port input of the VCO.

* * * * *